US011361834B1

(12) United States Patent
Kumar et al.

(10) Patent No.: US 11,361,834 B1
(45) Date of Patent: Jun. 14, 2022

(54) SYSTEMS AND METHODS FOR DUAL-PULSE PROGRAMMING

(71) Applicant: SanDisk Technologies LLC, Addison, TX (US)

(72) Inventors: Ravi Kumar, Redwood City, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/137,871

(22) Filed: Dec. 30, 2020

(51) Int. Cl.
*G11C 16/34* (2006.01)
*G11C 16/10* (2006.01)
*G11C 16/24* (2006.01)
*G11C 16/30* (2006.01)
*G11C 16/08* (2006.01)
*G11C 16/26* (2006.01)

(52) U.S. Cl.
CPC .......... *G11C 16/3454* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
USPC .................................................... 365/185.22
See application file for complete search history.

(56) References Cited

U.S. PATENT DOCUMENTS

| 7,173,859 | B2 | 2/2007 | Hemink |
| 7,602,650 | B2 | 10/2009 | Jung et al. |
| 7,715,235 | B2 | 5/2010 | Cernea |
| 8,773,910 | B2 | 7/2014 | Jones |
| 10,090,045 | B2 | 10/2018 | Hahn et al. |
| 2007/0297247 | A1 | 12/2007 | Hemink |
| 2019/0318792 | A1* | 10/2019 | Yang .................... G11C 16/26 |

* cited by examiner

*Primary Examiner* — Jason Lappas
(74) *Attorney, Agent, or Firm* — Dickinson Wright PLLC; Steven C. Hurles

(57) ABSTRACT

A memory device comprising control circuitry configured to apply a first program voltage to a selected word line, wherein a first subset of memory cells of the selected word line, that correspond to a first set of data states, are inhibited from being programmed with the first program voltage, and wherein the first program voltage is applied to a second subset of memory cells corresponding to a second set of data states. The control circuitry is further configured to cause a first voltage of the selected word line to discharge to a second voltage level corresponding to a second program voltage such that the second program voltage is applied to at least the first subset of memory cells. The control circuitry is further configured to perform a verify operation to verify whether the first subset of memory cells and the second subset of memory cells have completed programming.

20 Claims, 24 Drawing Sheets

SYSTEMS AND METHODS FOR DUAL-PULSE PROGRAMMING

BACKGROUND

1. Field of the Invention

The present technology relates to the operation of memory devices.

2. Related Art

Memory devices are typically provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

SUMMARY

One aspect of the present disclosure is related to a non-volatile memory comprising control circuitry for performing a program and verify operation to program an array of memory cells of a non-volatile memory. The control circuitry, when performing an iteration of the program and verify operation, may be configured to apply a first program voltage to a selected word line. The selected word line may include a first subset of memory cells corresponding to a first set of data states and a second subset of memory cells corresponding to a second set of data states. Respective memory cells, of the first subset of memory cells, may be inhibited from being programmed with the first program voltage. The first program voltage may be applied to the second subset of memory cells corresponding to the second set of data states. The control circuitry may be further configured to cause a first voltage level of the selected word line, which corresponds to the first program voltage, to discharge to a second voltage level corresponding to a second program voltage such that the second program voltage is applied to at least the first subset of memory cells. The control circuitry may be further configured to perform a verify portion of the program and verify operation to verify whether the first subset of memory cells and the second subset of memory cells have completed programming.

Another aspect of the present disclosure is related to a method of programming memory cells of a non-volatile memory. The method includes applying, as part of an iteration of a program and verify operation, a first program voltage to a selected word line. The selected word line may include a first subset of memory cells corresponding to a first set of data states and a second subset of memory cells corresponding to a second set of data states. Respective memory cells, of the first subset of memory cells, may be inhibited from being programmed with the first program voltage. The first program voltage may be applied to the second subset of memory cells corresponding to the second set of data states. The method further includes causing a first voltage level of the selected word line, which corresponds to the first program voltage, to discharge to a second voltage level corresponding to a second program voltage such that the second program voltage is applied to at least the first subset of memory cells. The method further includes performing, as part of the iteration of the program and verify operation, a verify operation to verify whether the first subset of memory cells and the second subset of memory cells have completed programming.

Yet another aspect of the present disclosure is related to a memory device comprising control circuitry for programming memory cells. The memory cells may be part of an array of memory cells of a non-volatile memory. The control circuitry may be configured to apply a first program voltage to a selected word line. The selected word line may include a first subset of memory cells corresponding to a first set of data states and a second subset of memory cells corresponding to a second set of data states. Respective memory cells, of the first subset of memory cells, may be inhibited from being programmed with the first program voltage. The first program voltage may be applied to the second subset of memory cells corresponding to the second set of data states. The control circuitry may be further configured to cause a first voltage level of the selected word line, which corresponds to the first program voltage, to discharge to a second voltage level corresponding to a second program voltage such that the second program voltage is applied to at least the first subset of memory cells. The control circuitry may be further configured to perform a verify portion of the program and verify operation to verify whether the first subset of memory cells and the second subset of memory cells have completed programming.

BRIEF DESCRIPTION OF THE DRAWINGS

The accompanying drawings, which are incorporated in and constitute a part of this specification illustrate various aspects of the present disclosure and together with the description, serve to explain its principles. Wherever convenient, the same reference numbers will be used throughout the drawings to refer to the same or like elements.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A program and verify operation for a set of memory cells typically involves applying a series of program voltages to memory cells of a selected word line, after the memory cells are provided in an erased data state. Each program voltage is provided in a program loop, also referred to as an iteration of the program and verify operation. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it may be locked out from further programming while programming continues for other memory cells in subsequent program loops. The program and verify operation may be a multistep program and verify operation, a full sequence or one-step program and verify operation, or another type of program and verify operation.

Figure 10:
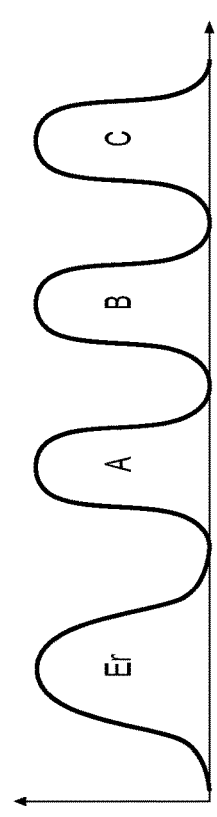
FIG. 10 depicts the Vth distributions of memory cells in an example programming operation with four data states.
Figure 11:
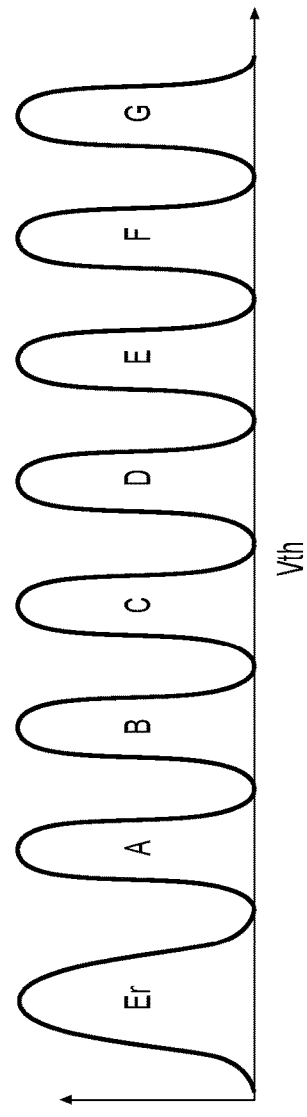
FIG. 11 depicts the Vth distributions of memory cells in an example programming operation with eight data states
Figure 12:
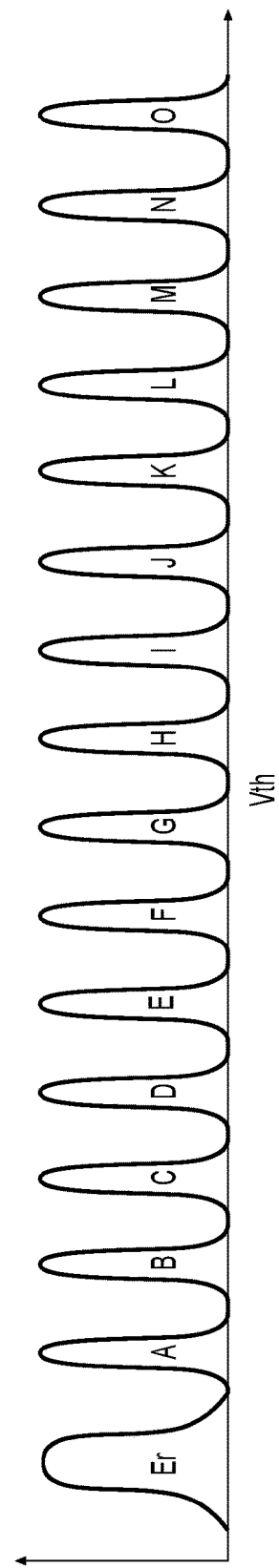
FIG. 12 depicts the Vth distributions of memory cells in an example programming operation with sixteen data states

Each memory cell may be associated with a data state according to write data in a program command. A memory cell may be in an erased data state (referred to herein as an erased data state) or may be programmed to a programmed data state (referred to herein as a programmed data state) that is different from the erased data state. For example, in a two-bit per cell memory device, there are four data states including the erased data state and three programmed data states referred to as the A, B and C data states (see FIG. 10). In a three-bit per cell memory device, there are eight data states including the erased data state and seven programmed data states referred to as the A, B, C, D, E, F and G data states (see FIG. 11). In a four-bit per cell memory device, there are sixteen data states including the erased data state and fifteen programmed data states referred to as the Er, A, B, C, D, E, F, G, H, I, J, K, L, M, N, and O (see FIG. 12), data states. These may also be referred to numerically, as data states 0, 1, 2, 3, 4, 5, 6, 7, 8, 9, 10, 11, 12, 13, 14, and 15, respectively.

When a program command is issued, the write data is stored in latches associated with the memory cells. During programming, the latches of a memory cell may be read to determine the data state to which the cell is to be programmed. Each programmed data state is associated with a verify voltage such that a memory cell with a given data state is considered to have completed programming when a read (sense) operation determines its threshold voltage (Vth) is above the associated verify voltage. A read (sense) operation may determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

However, many techniques or configurations for programming memory cells are unable to efficiently and/or effectively achieve fast programming. For example, in one known approach, incrementally increasing program pulses are applied with each iteration of a program operation. Under this approach, long charge-up times for selected and unselected word lines may delay completion of the programming operation. In this and other approaches, inefficient techniques for programming often require more iterations to complete programming (e.g., relative to techniques described herein), further increasing a total programming time and/or a total verify time.

Some embodiments described herein include a control circuitry of a memory device that uses multiple program pulses to program a set of memory cells of a selected word line. For example, the control circuitry may apply a first program voltage (VpgmH) to a selected word line that includes a first subset of memory cells corresponding to low data states and a second subset of memory cells corresponding to high data states. The first subset of memory cells corresponding to low data states may have been inhibited from being programmed with the first program voltage (VpgmH). For example, the control circuitry may have previously provided an inhibit program voltage (VDDSA) to bit lines associated with the first subset of memory cells. As such, the first program voltage (VpgmH) may be used to program the second subset of memory cells corresponding to high data states (but not the first subset of memory cells corresponding to low data states).

Furthermore, the control circuitry may cause a voltage level of bit lines associated with the first subset of memory cells to discharge from a first voltage level corresponding to the inhibit program voltage (VDDSA) to a second voltage level corresponding to zero volts. This will allow the first subset of memory cells to be programmed. Next, the control circuitry may cause a voltage level of the selected word line to discharge from a first voltage level corresponding to the first program voltage (VpgmH) to a lesser second voltage level corresponding to a second program voltage (VpgmL). For example, the control circuitry may be configured to wait a threshold time period before verifying whether memory cells of the selected word line have been programmed. During the threshold wait time period, the voltage level of the selected word line (and/or a voltage level at each respective memory cell) may dissipate to a value corresponding to the second program voltage (VpgmL). This will allow the first subset of memory cells corresponding to low data states to be programmed using the second program voltage (VpgmL), while the second subset of memory cells corresponding to high data states are or are to be programmed using the first program voltage (VpgmH). The control circuitry may then perform a verify operation to verify whether both the first and second subsets of memory cells have completed programming.

In this way, the control circuitry programs the set of memory cells of the selected word line using multiple program voltages. Furthermore, the control circuitry conserves resources (e.g., processing resources, memory resources, and/or the like) by reducing program and verify operation execution time relative to other known systems and methods (e.g., that require more voltage pulses to program, that has a higher total programming time, etc.).

Figure 1A:
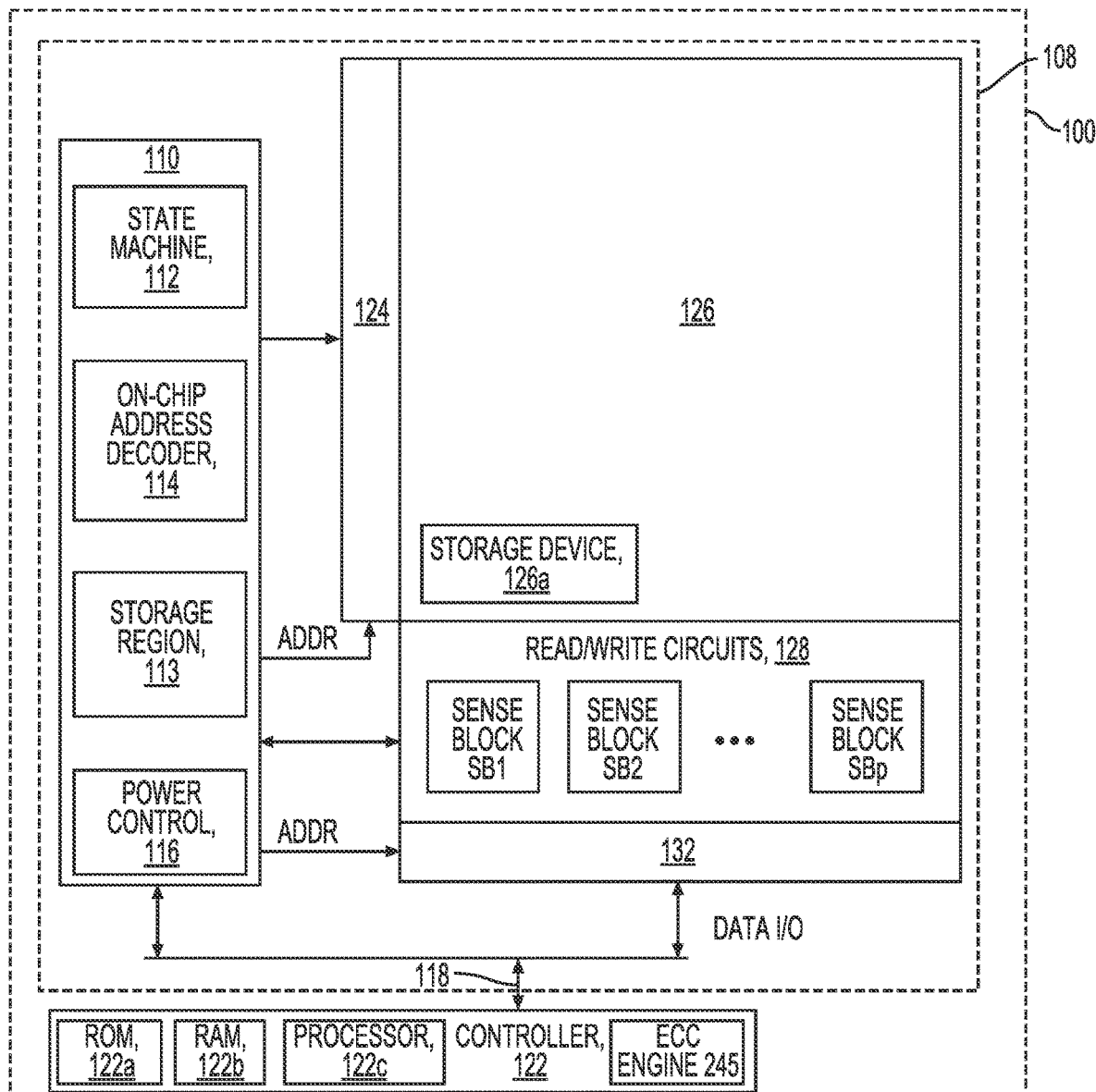
FIG. 1A illustrates a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for the another data state for the memory cells assigned to represent the another data state.

Figure 1B:
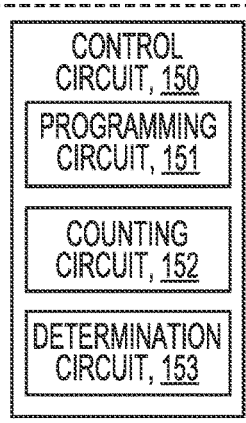
FIG. 1B illustrates a block diagram of an example control circuit which comprises a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
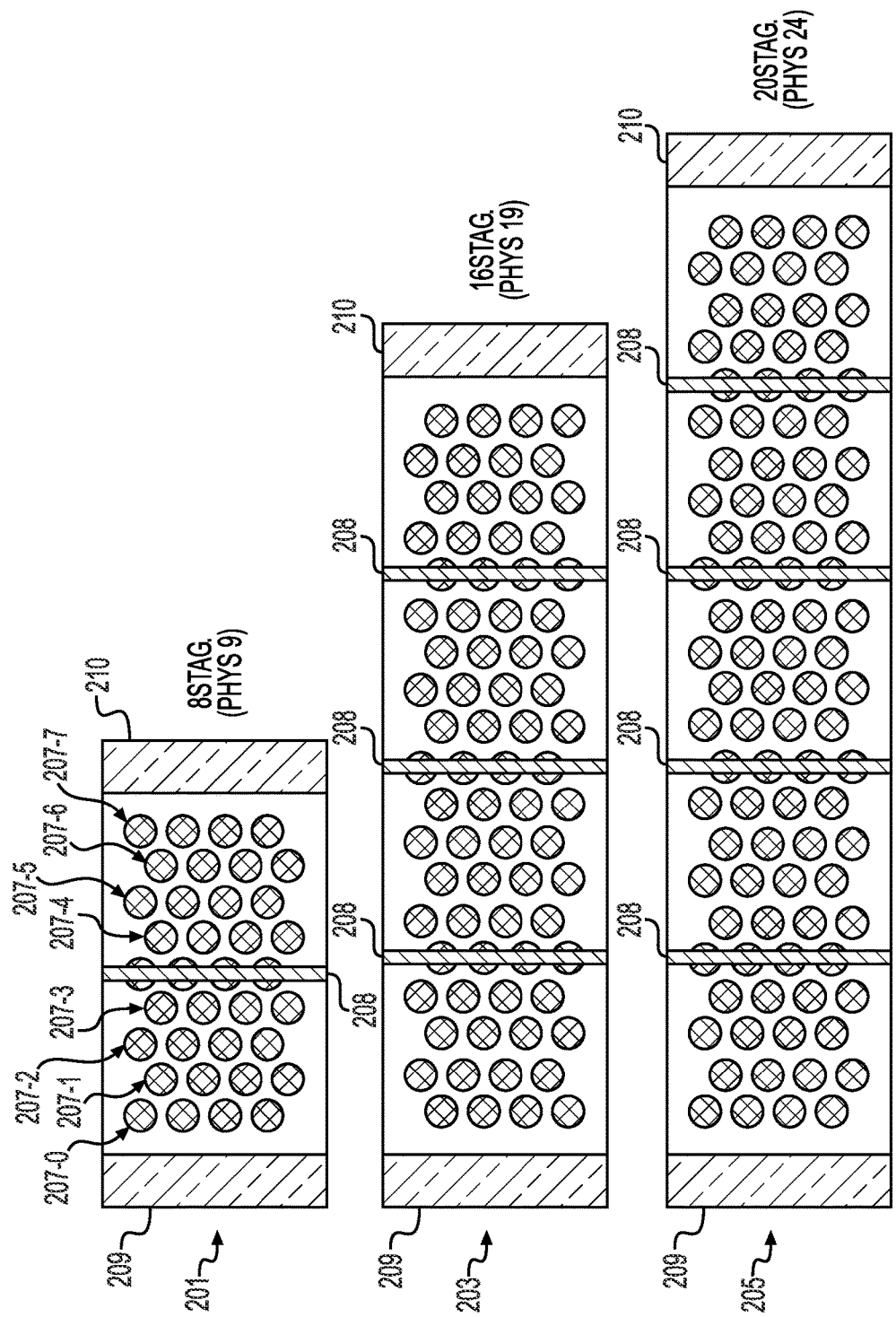
FIG. 2 illustrates a schematic view of three memory string architectures according to the principles of the present disclosure.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In the memory architecture 205, there may be five NAND string groups. In the example shown, each respective NAND string group may be separated by a dummy row 208. In this example, there are two outer-most NAND string groups, two inner NAND string groups (inner relative to an outer-most NAND string group), and an inner-most NAND string group.

In some embodiments, the memory architecture 205 may be a three-dimensional memory architecture that includes one or more three-dimensional blocks. In this case, a three-dimensional block may be logically segmented into multiple sub-blocks corresponding to NAND string groups. The three-dimensional block may also be segmented into multiple planes. Additional block description is provided further herein.

It is to be understood that the memory architectures shown in FIG. 2 are provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

Figure 3:
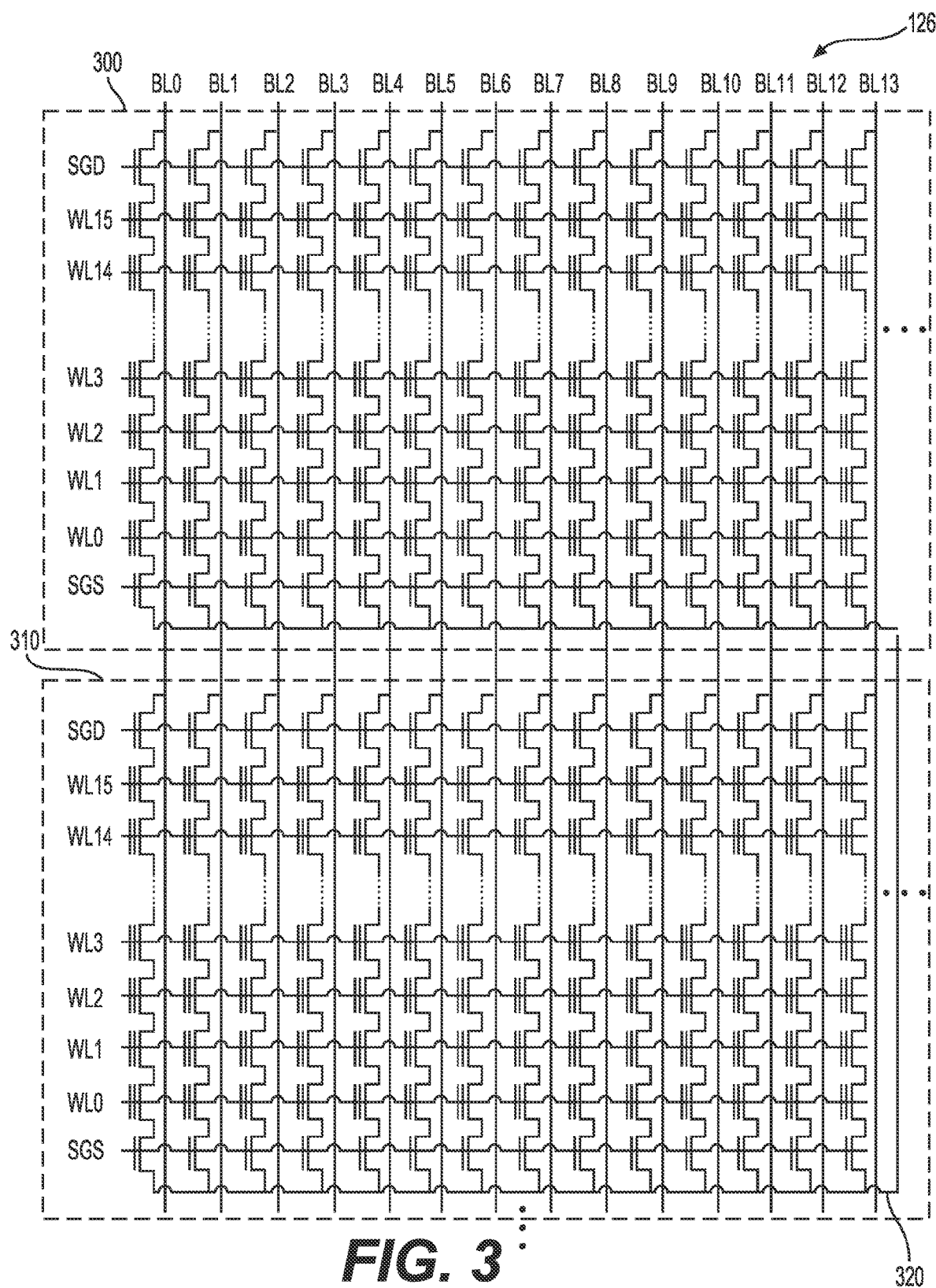
FIG. 3 illustrates blocks of memory cells in an example two-dimensional configuration of the memory array of FIG. 1.

FIG. 3 illustrates blocks 300, 310 of memory cells in an example two-dimensional configuration of the memory array 126 of FIG. 1. The memory array 126 can include many such blocks 300, 310. Each example block 300, 310 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line (SGS) 320. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 4A:
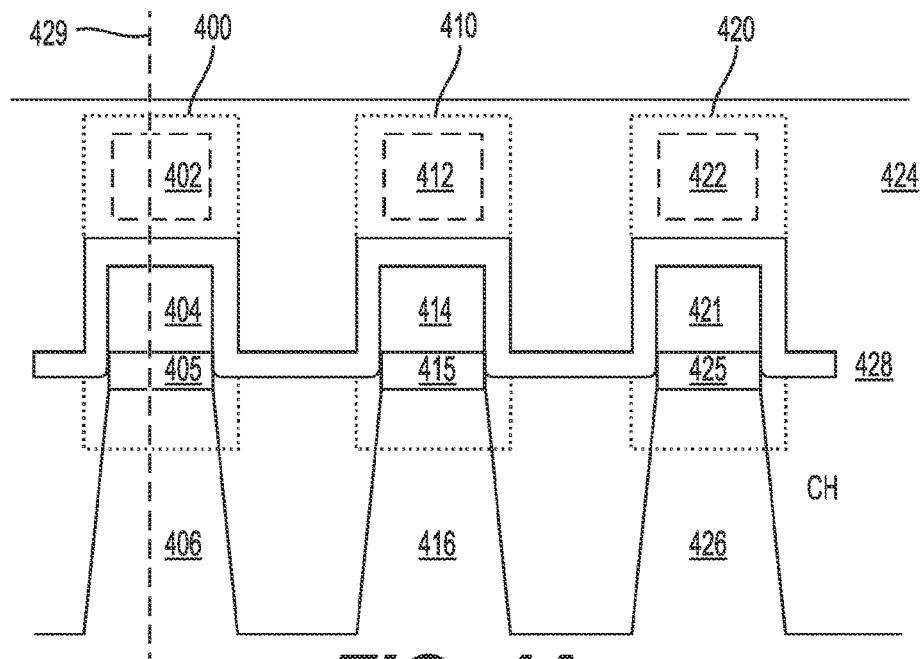
FIG. 4A illustrates a cross-sectional view of example floating gate memory cells in NAND strings.
Figure 4B:
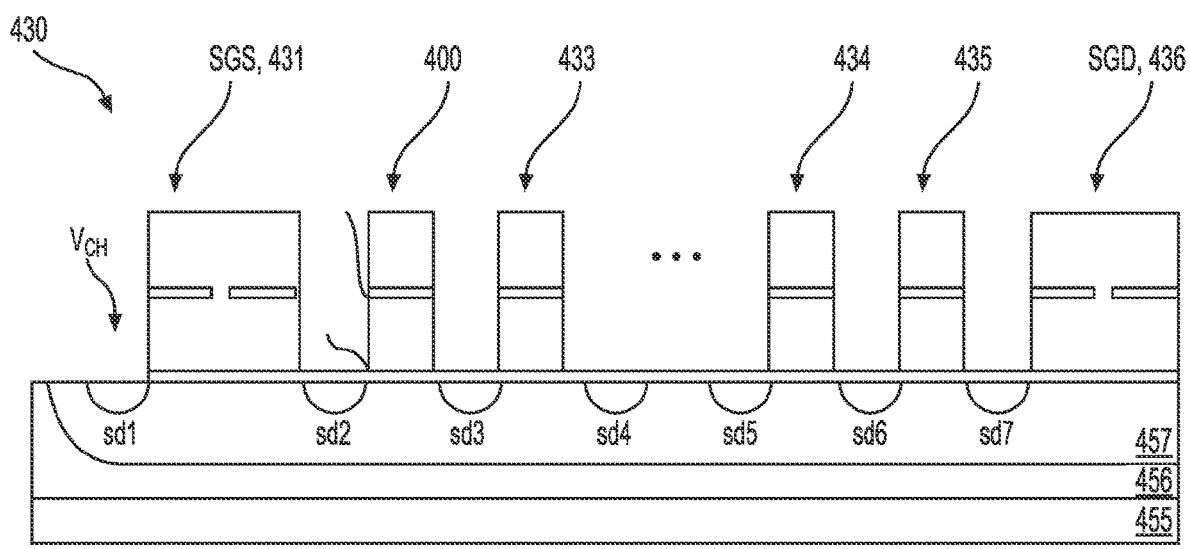
FIG. 4B illustrates a cross-sectional view of the structure of FIG. 4A along line 429.

One type of non-volatile memory which may be provided in the memory array is a floating gate memory, such as of the type shown in FIGS. 4A and 4B. However, other types of non-volatile memory can also be used. As discussed in further detail below, in another example shown in FIGS. 5A and 5B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 4A illustrates a cross-sectional view of example floating gate memory cells 400, 410, 420 in NAND strings. In this figure, a bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell 400, 410, 420 is in a different respective NAND string. An inter-poly dielectric (IPD) layer 428 is also illustrated. The control gates 402, 412, 422 are portions of the word line. A cross-sectional view along contact line connector 429 is provided in FIG. 4B.

The control gate 402, 412, 422 wraps around the floating gate 404, 414, 421, increasing the surface contact area between the control gate 402, 412, 422 and floating gate 404, 414, 421. This results in higher IPD capacitance, leading to a higher coupling ratio which makes programming and erase easier. However, as NAND memory devices are scaled down, the spacing between neighboring cells 400, 410, 420 becomes smaller so there is almost no space for the control gate 402, 412, 422 and the IPD layer 428 between two adjacent floating gates 402, 412, 422.

Figure 5A:
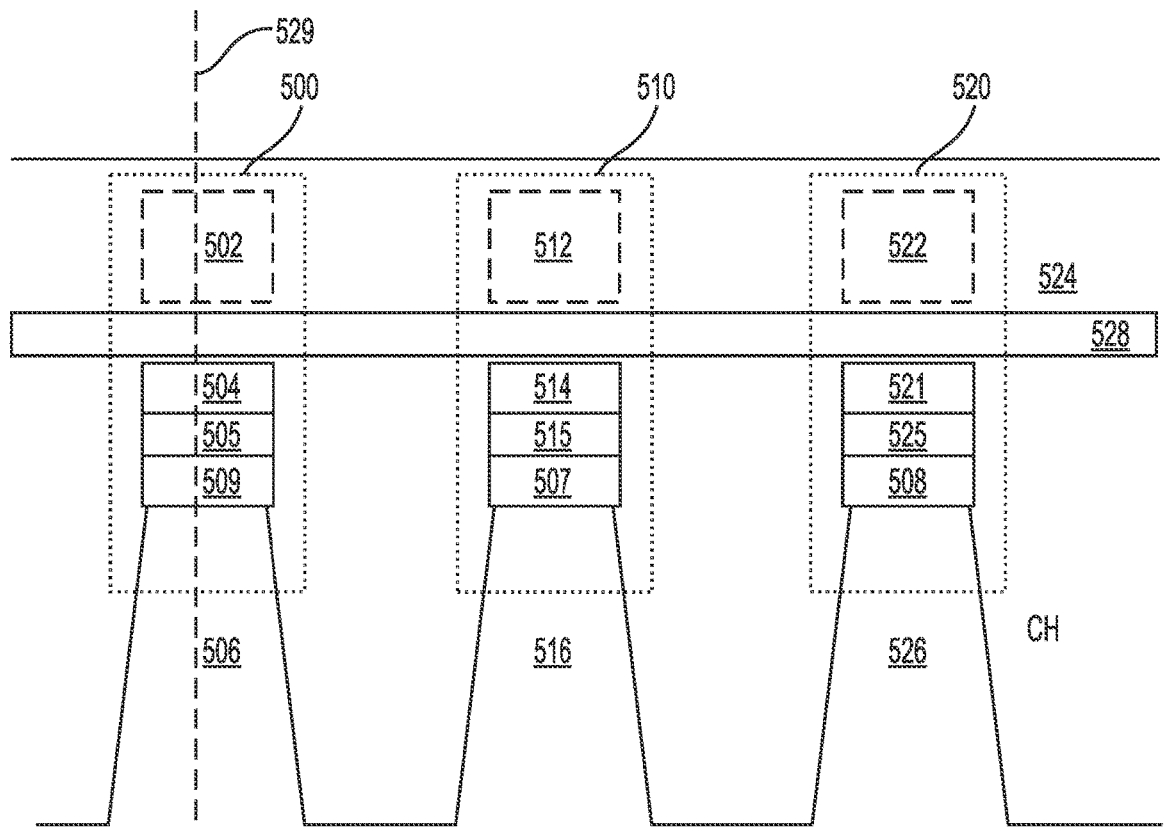
FIG. 5A illustrates a cross-sectional view of example charge-trapping memory cells in NAND strings.
Figure 5B:
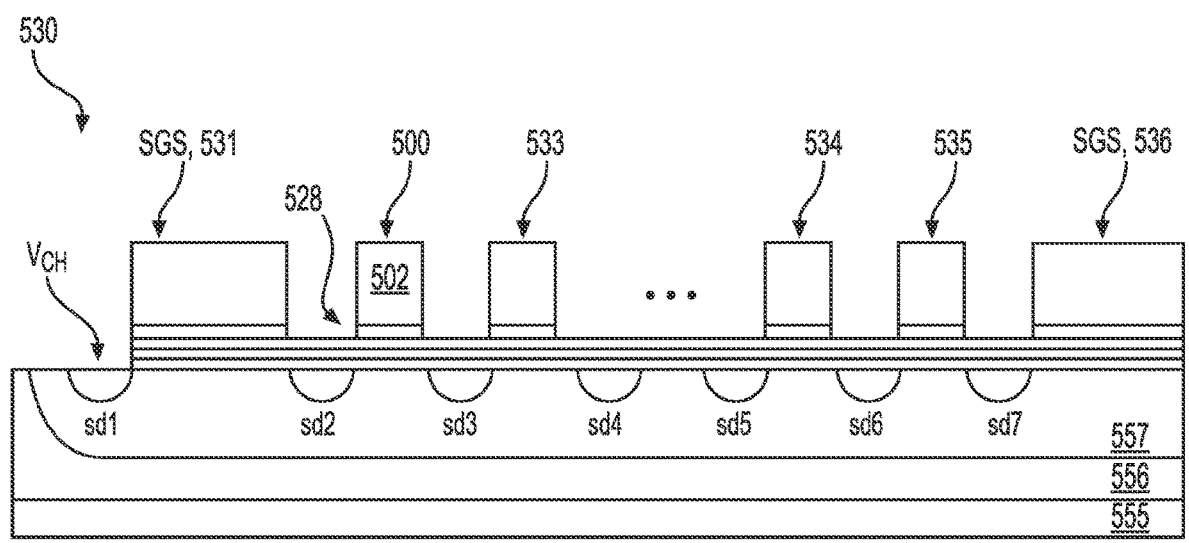
FIG. 5B illustrates a cross-sectional view of the structure of FIG. 5A along line 429.

As an alternative, as shown in FIGS. 5A and 5B, the flat or planar memory cell 500, 510, 520 has been developed in which the control gate 502, 512, 522 is flat or planar; that is, it does not wrap around the floating gate and its only contact with the charge storage layer 528 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5A depicts a cross-sectional view of example charge-trapping memory cells 500, 510, 520 in NAND strings. The view is in a word line direction of memory cells 500, 510, 520 comprising a flat control gate and charge-trapping regions as a two-dimensional example of memory cells 500, 510, 520 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 524 extends across NAND strings which include respective channel regions 506, 516, 526. Portions of the word line provide control gates 502, 512, 522. Below the word line is an IPD layer 528, charge-trapping layers 504, 514, 521, polysilicon layers 505, 515, 525, and tunneling layers 509, 507, 508. Each charge-trapping layer 504, 514, 521 extends continuously in a respective NAND string. The flat configuration of the control gate can be made thinner than a floating gate. Additionally, the memory cells can be placed closer together.

FIG. 5B illustrates a cross-sectional view of the structure of FIG. 5A along contact line connector 529. The NAND string 530 includes an SGS transistor 531, example memory cells 500, 533, . . . 535, and an SGD transistor 536. Passageways in the IPD layer 528 in the SGS and SGD transistors 531, 536 allow the control gate layers 502 and floating gate layers to communicate. The control gate 502 and floating gate layers may be polysilicon and the tunnel oxide layer may be silicon oxide, for instance. The IPD layer 528 can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
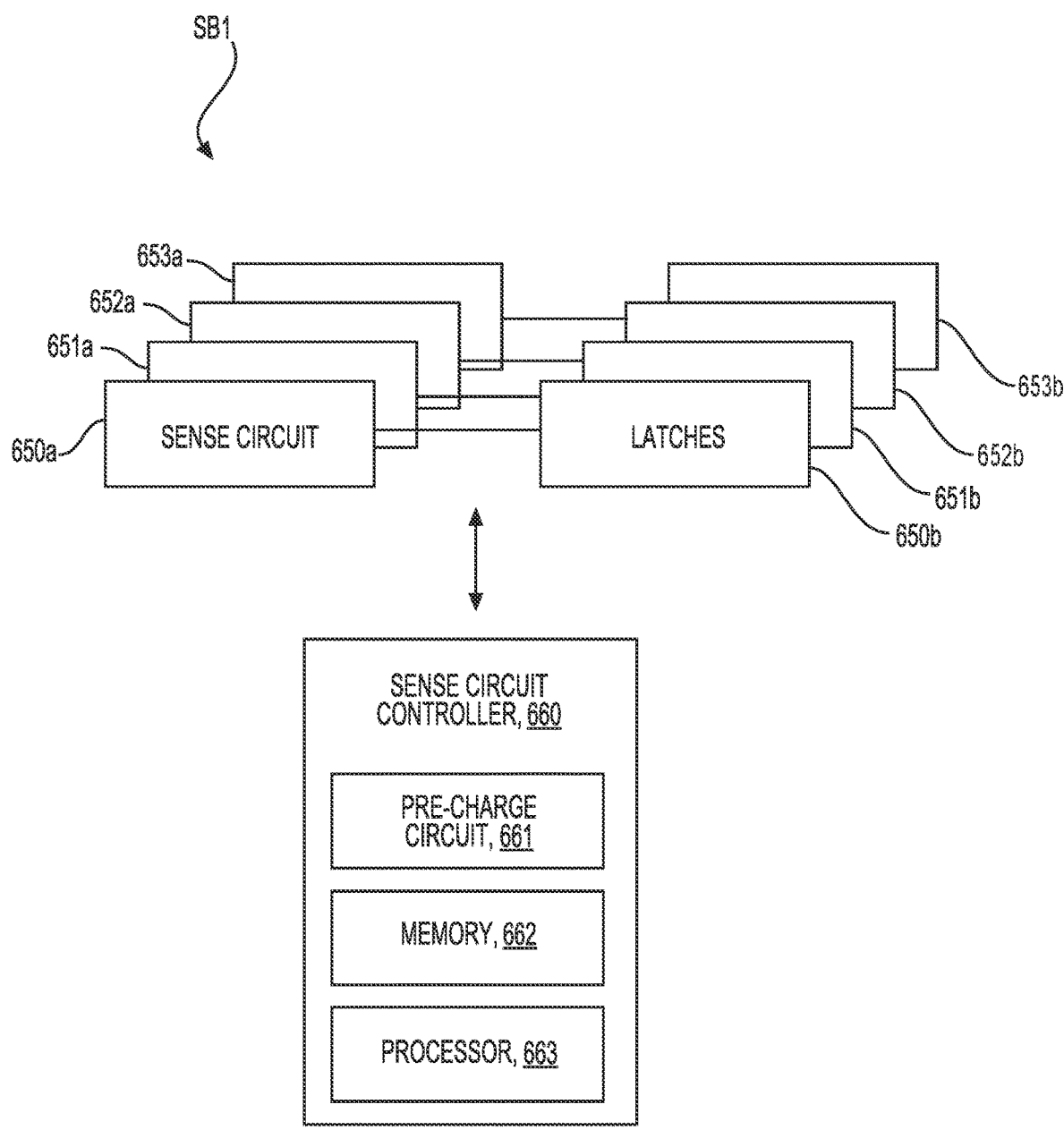
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 653a are associated with the data latches 650b, 651b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller 660 may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller 660 may also include a memory 662 and a processor 663. The memory 662 may store code which is executable by the processor to perform the functions described herein. These functions can include reading the latches 650b, 651b, 652b, 653b which are associated with the sense circuits 650a, 651a, 652a, 653a, setting bit values in the latches and providing voltages for setting pre-charge levels in sense nodes of the sense circuits 650a, 651a, 652a, 653a. Further example details of the sense circuit controller 660 and the sense circuits 650a and 651a are provided below.

Figure 6B:
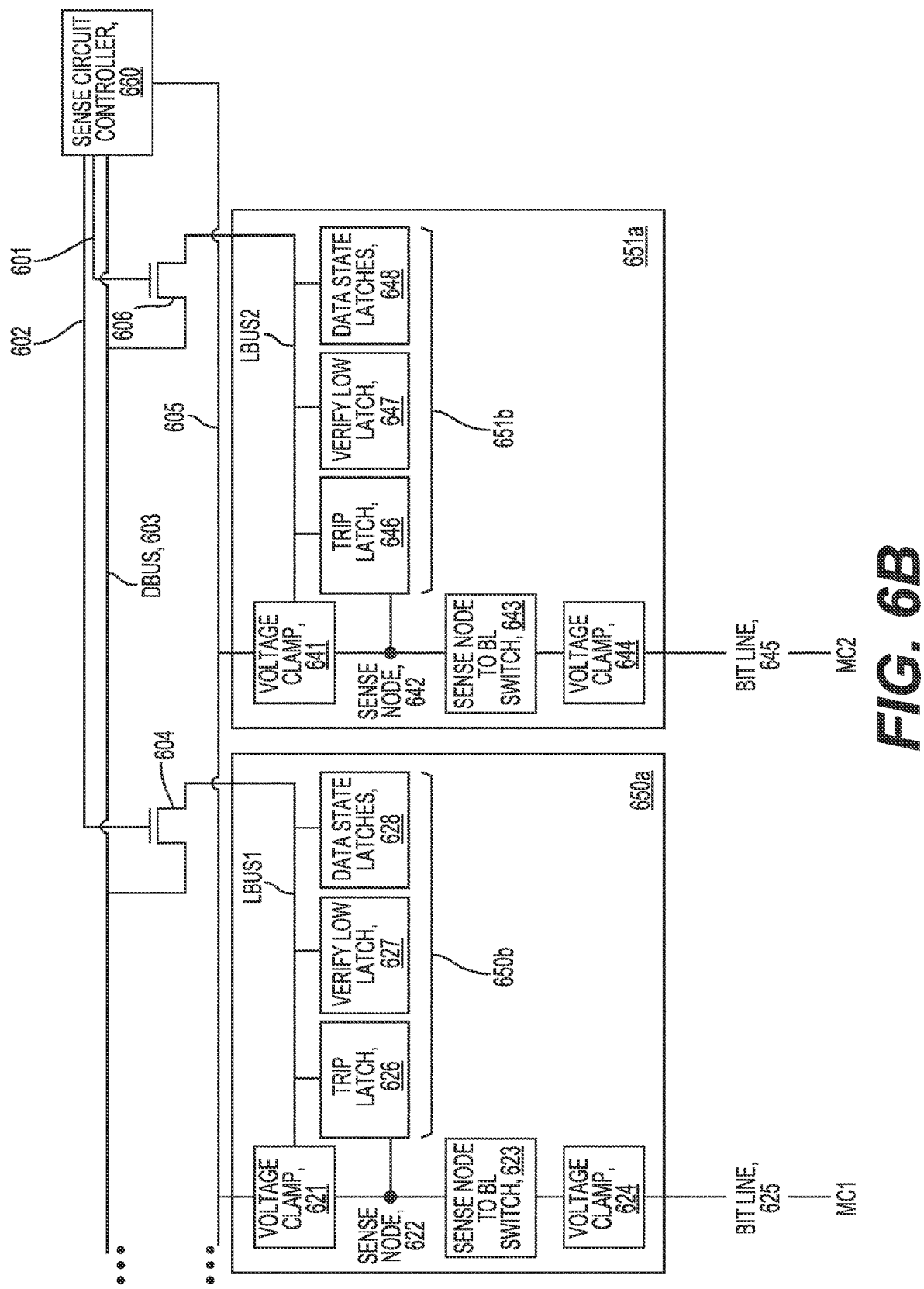
FIG. 6B illustrates another example block diagram of the sense block SB1 of FIG. 1.

With reference to FIG. 6B, the sense circuit controller 660 can communicate with different sense circuits 650a, 651a in a time-multiplexed manner, for instance. A contact line 605 may be connected to the voltage clamp 621,641 in each sense circuit 650a, 651a, in one approach.

Each sense circuit 650a, 651a includes latches 650b, 651b, including a trip latch 626, 646, an offset verify latch 627, 647 and data state latches 628, 648. A voltage clamp 621, 641 may be used to set a pre-charge voltage at a sense node 622, 642. A sense node to bit line (BL) switch 623, 643 selectively allows the sense node 622, 642 to communicate with a bit line 625, 645, and a voltage clamp 624, 644 can set a voltage on the bit line 625, 645, such as during a sensing operation or a programming operation. The bit line 625, 645 is connected to one or more memory cells such as memory cells MC1 and MC2. A local bus, LBUS1, LBUS2, allows the sense circuit controller 660 to communicate with components in the sense circuit 650a, 651a, such as the latches 650b, 651b and the voltage clamp 621, 641 in some cases. To communicate with the sense circuit 650a, 651a, the sense circuit controller 660 provides a voltage via a contact line 601, 602 to a transistor 604, 606 to connect LBUS1, LBUS2 with DBUS 603. The communicating can include sending data to the sense circuit 650a, 651a and/or receive data from the sense circuit 650a, 651a.

The sense circuit 650a may be a first sense circuit which comprises a first trip latch 626, and the sense circuit 651a may be a second sense circuit which comprises a second trip latch 646. The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 7A:
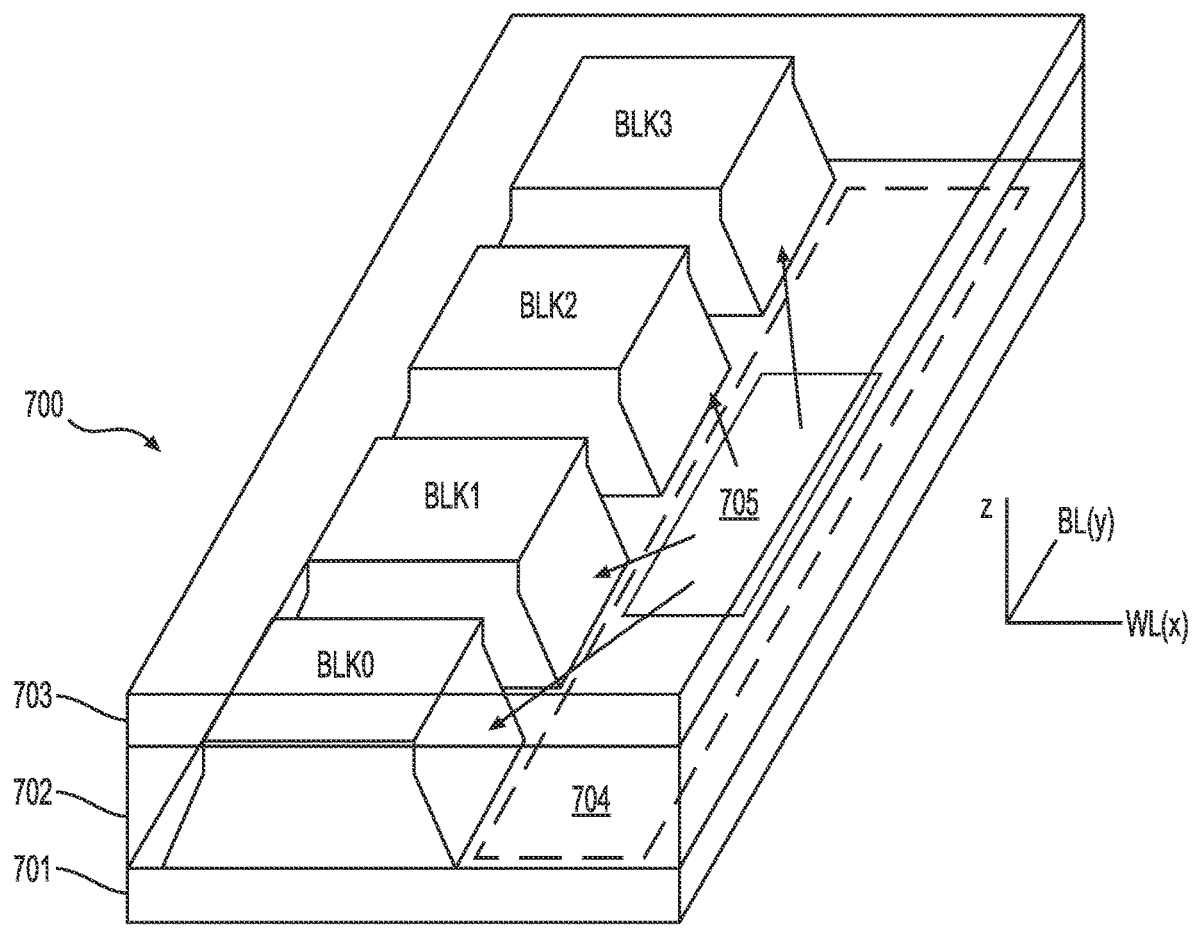
FIG. 7A illustrates a perspective view of a set of blocks in an example three-dimensional configuration of the memory array of FIG. 1.

FIG. 7A is a perspective view of a set of blocks 700 in an example three-dimensional configuration of the memory array 126 of FIG. 1. On the substrate are example blocks BLK0, BLK1, BLK2, BLK3 of memory cells (storage elements) and a peripheral area 704 with circuitry for use by the blocks BLK0, BLK1, BLK2, BLK3. For example, the circuitry can include voltage drivers 705 which can be connected to control gate layers of the blocks BLK0, BLK1, BLK2, BLK3. In one approach, control gate layers at a common height in the blocks BLK0, BLK1, BLK2, BLK3 are commonly driven. The substrate 701 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 702 of the memory device. In an upper region 703 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
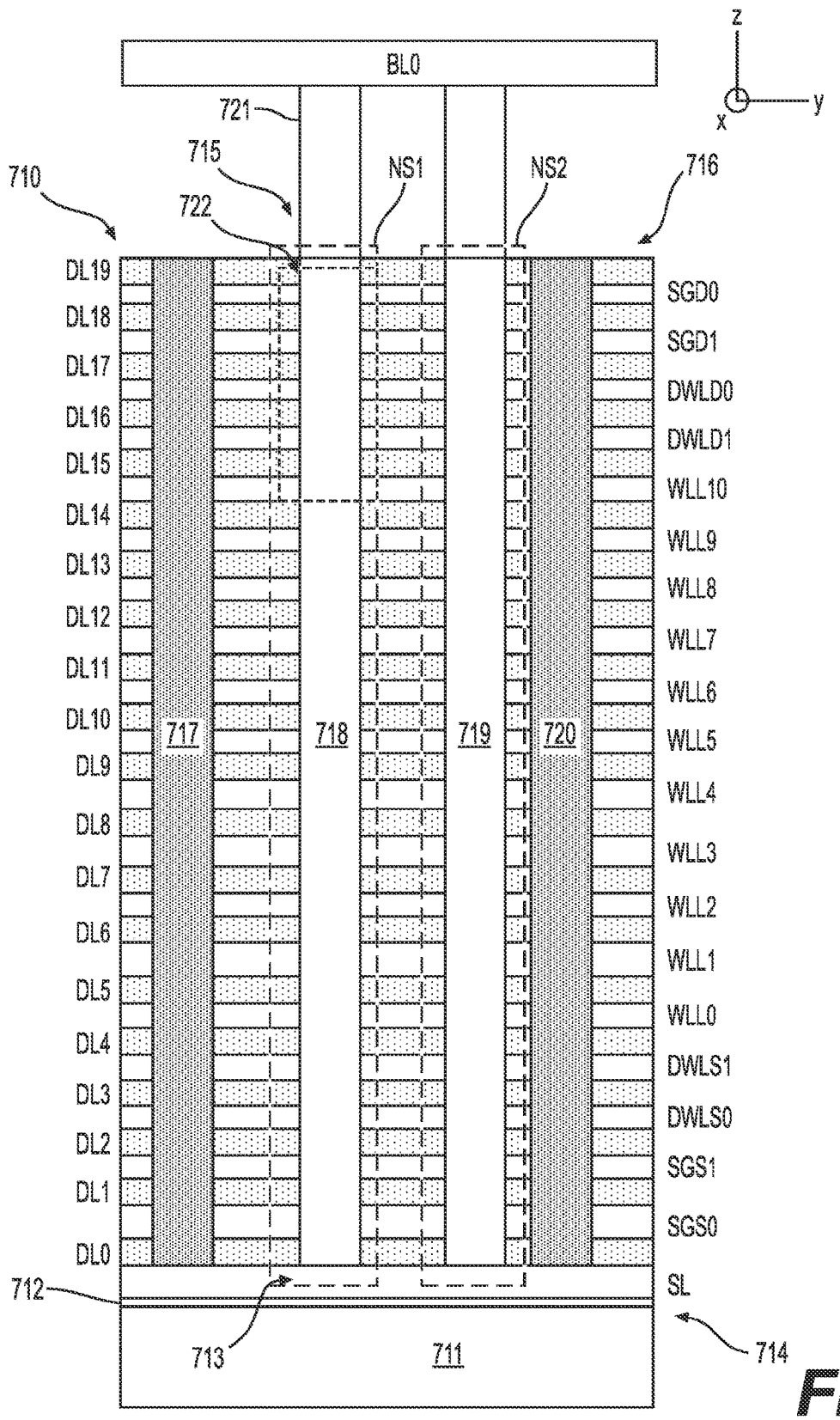
FIG. 7B illustrates an example cross-sectional view of a portion of one of the blocks of FIG. 7A.

FIG. 7B illustrates an example cross-sectional view of a portion of one of the blocks BLK0, BLK1, BLK2, BLK3 of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 710 which comprise NAND strings NS1 and NS2 are illustrated. Each NAND string encompasses a memory hole 718, 719 which is filled with materials which form memory cells adjacent to the word lines. A region 722 of the stack 710 is shown in greater detail in FIG. 7D and is discussed in further detail below.

The 710 stack includes a substrate 711, an insulating film 712 on the substrate 711, and a portion of a source line SL. NS1 has a source-end 713 at a bottom 714 of the stack and a drain-end 715 at a top 716 of the stack 710. Contact line connectors (e.g., slits, such as metal-filled slits) 717, 720 may be provided periodically across the stack 710 as interconnects which extend through the stack 710, such as to connect the source line to a particular contact line above the stack 710. The contact line connectors 717, 720 may be used during the formation of the word lines and subsequently filled with metal. A portion of a bit line BL0 is also illustrated. A conductive via 721 connects the drain-end 715 to BL0.

Figure 7C:
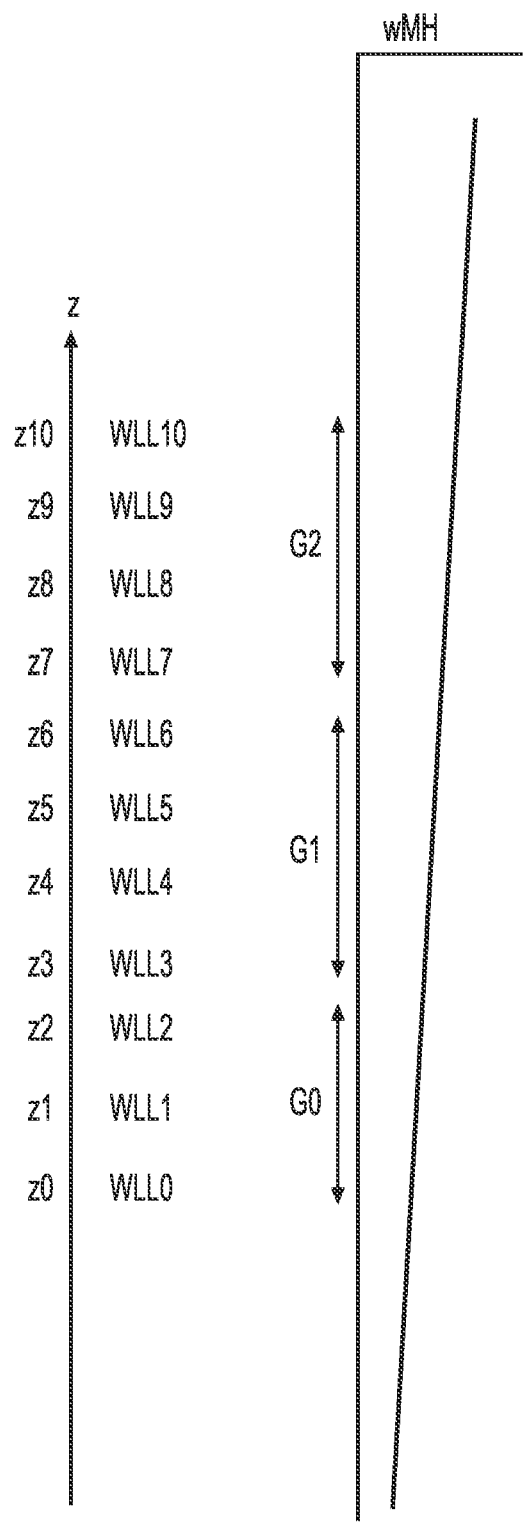
FIG. 7C illustrates a plot of memory hole diameter in the stack of FIG. 7B.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 7D:
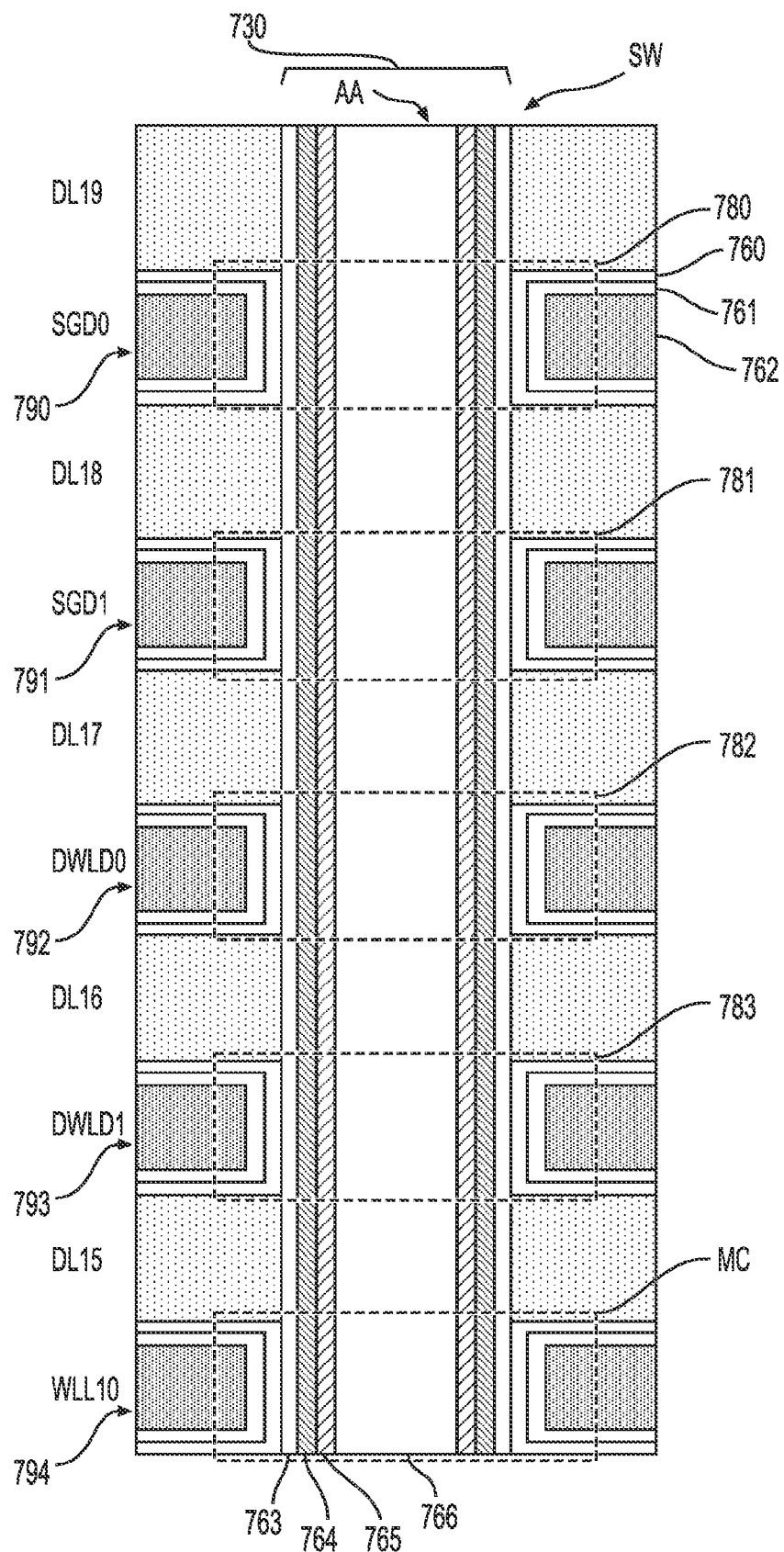
FIG. 7D illustrates a close-up view of the region 622 of the stack of FIG. 7B.

FIG. 7D illustrates a close-up view of the region 722 of the stack 710 of FIG. 7B. Memory cells are formed at the different levels of the stack at the intersection of a word line layer and a memory hole. In this example, SGD transistors 780, 781 are provided above dummy memory cells 782, 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole 730) can include a charge-trapping layer or film 763 such as SiN or other nitride, a tunneling layer 764, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole 730. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 730 can be filled with a plurality of annular layers comprising a blocking oxide layer, a charge trapping layer 763, a tunneling layer 764 and a channel layer. A core region of each of the memory holes 730 is filled with a body material, and the plurality of annular layers are between the core region and the word line in each of the memory holes 730.

The NAND string can be considered to have a floating body channel because the length of the channel is not formed on a substrate. Further, the NAND string is provided by a plurality of word line layers above one another in a stack, and separated from one another by dielectric layers.

Figure 8A:
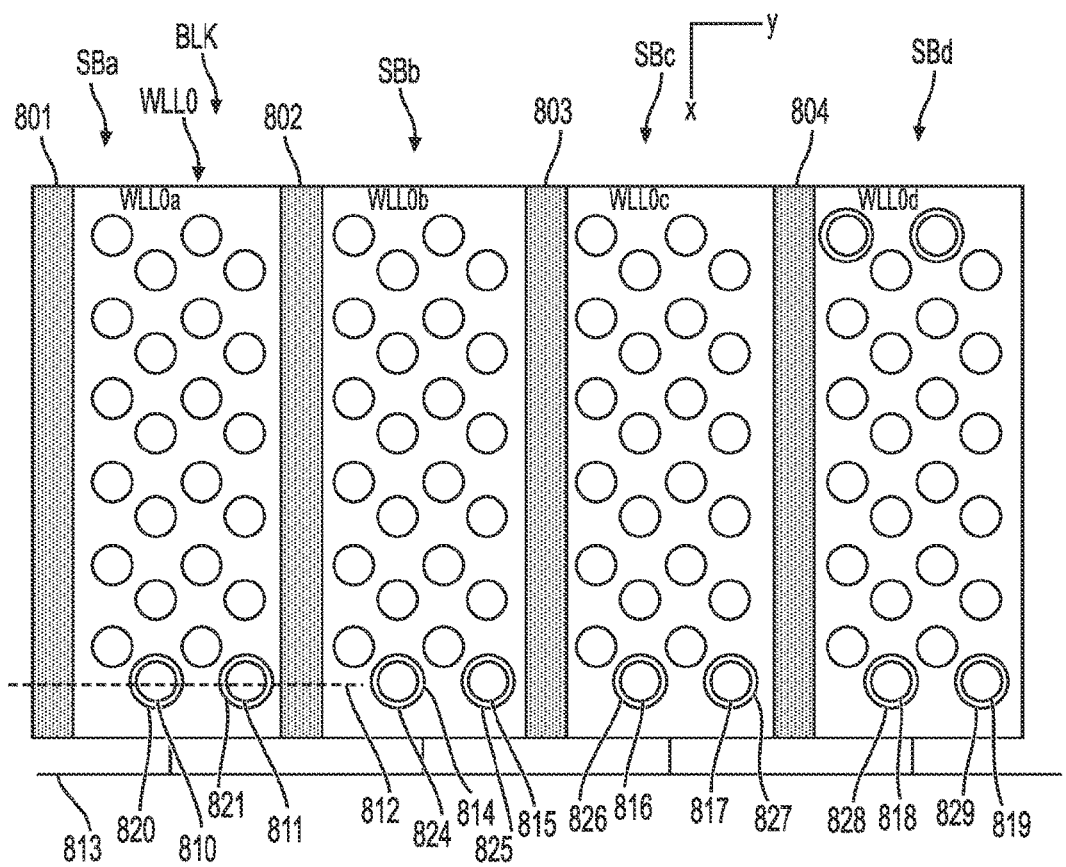
FIG. 8A illustrates a top view of an example word line layer WLL0 of the stack of FIG. 6B.

FIG. 8A illustrates a top view of an example word line layer WLL0 of the stack 710 of FIG. 7B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 8B:
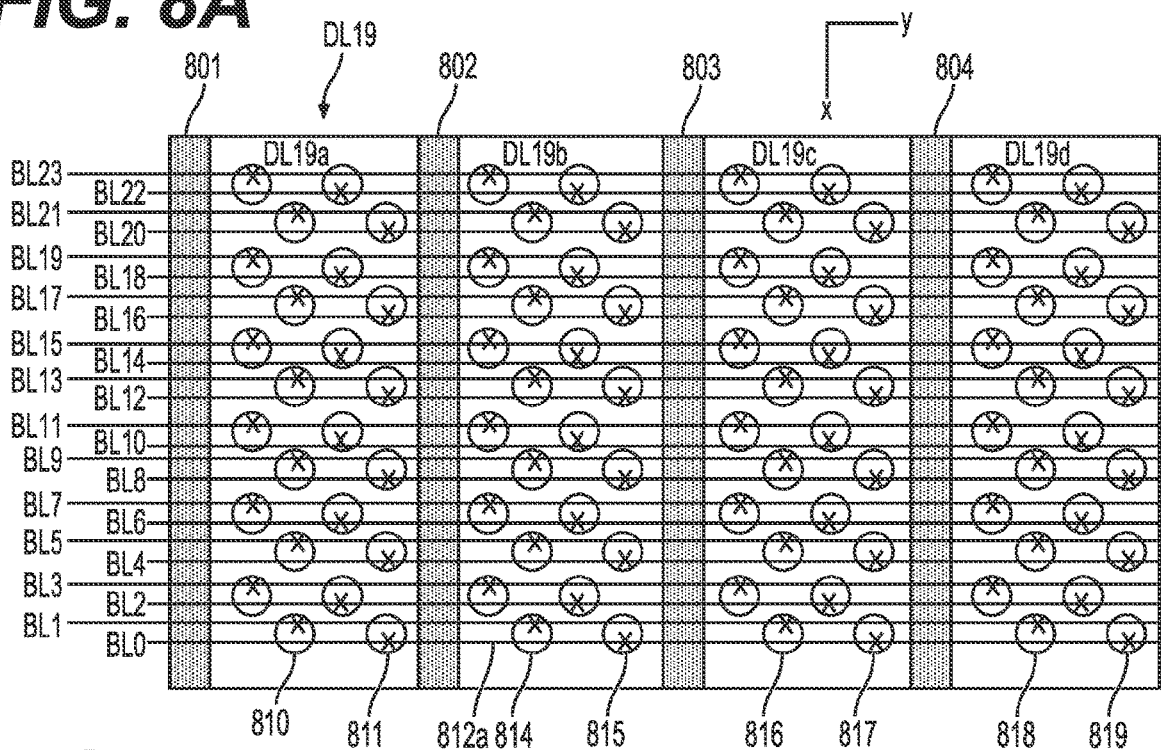
FIG. 8B illustrates a top view of an example top dielectric layer DL19 of the stack of FIG. 7B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 *a*, WLL0 *b*, WLL0 *c* and WLL0*d* which are each connected by a contact line 813. The last region of a word line layer in a block can be connected to a first region of a word line layer in a next block, in one approach. The contact line 813, in turn, is connected to a voltage driver for the word line layer. The region WLL0*a* has example memory holes 810. 811 along a contact line 812. The region WLL0*b* has example memory holes 814, 815. The region WLL0*c* has example memory holes 816, 817. The region WLL0*d* has example memory holes 818, 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0*a*, memory cells 824, 825 are in WLL0*b*, memory cells 826, 827 are in WLL0*c*, and memory cells 828, 829 are in WLL0*d*. These memory cells are at a common height in the stack.

Contact line connectors (e.g., slits, such as metal-filled slits) 801, 802, 803, 804 may be located between and adjacent to the edges of the regions WLL0*a*-WLL0*d*. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19*a*, DL19*b*, DL19*c* and DL19*d*. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19*a* has the example memory holes 810, 811 along a contact line 812*a*, which is coincident with a bit line BL0. A number of bit lines extend above the memory holes and are connected to the memory holes as indicated by the "X" symbols. BL0 is connected to a set of memory holes which includes the memory holes 811, 815, 817, 819. Another example bit line BL1 is connected to a set of memory holes which includes the memory holes 810, 814, 816, 818. The contact line connectors (e.g., slits, such as metal-filled slits) 801, 802, 803, 804 from FIG. 8A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 9A:
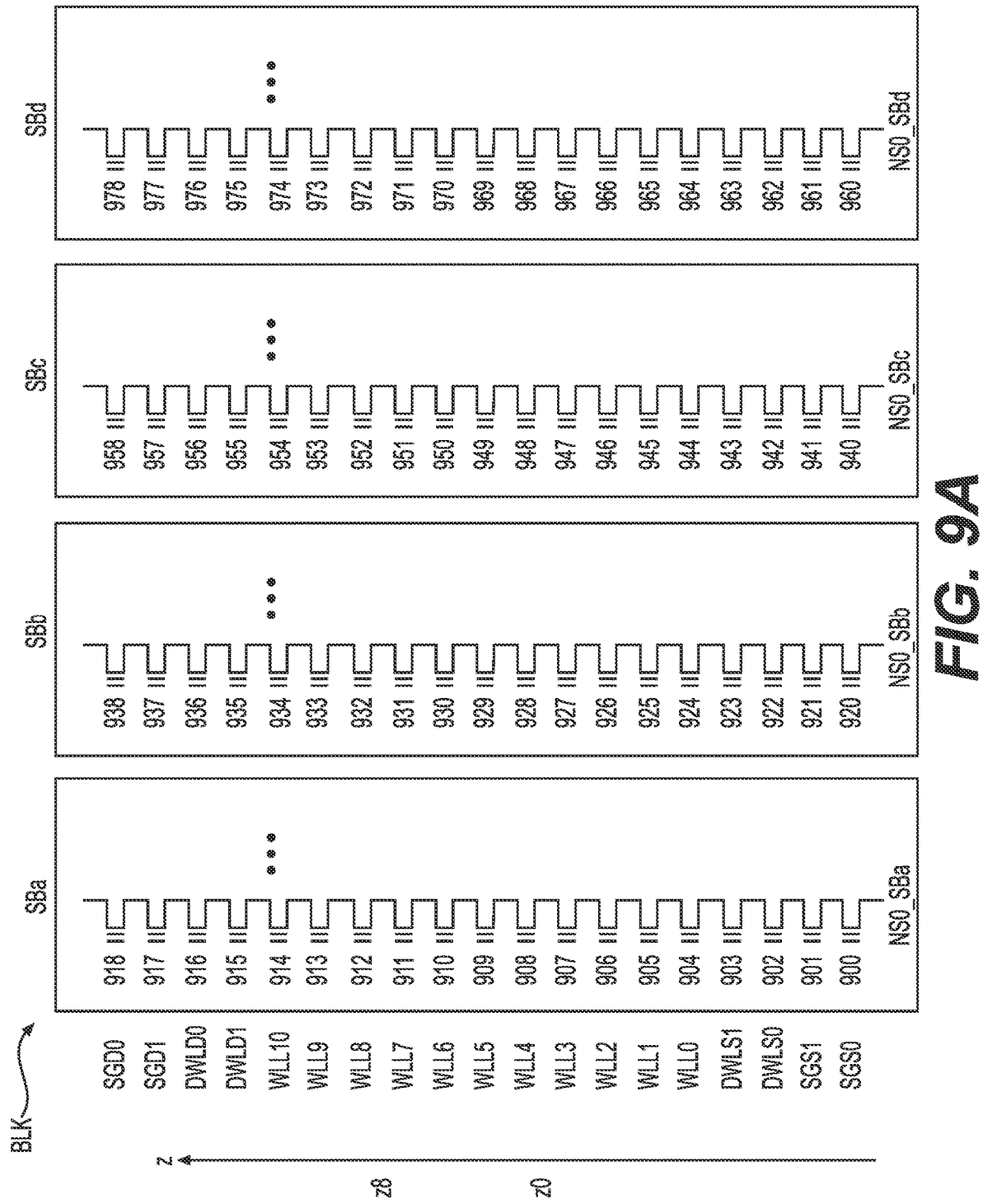
FIG. 9A illustrates example NAND strings in the sub-blocks SBa-SBd of FIG. 8A.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

Figure 9B:
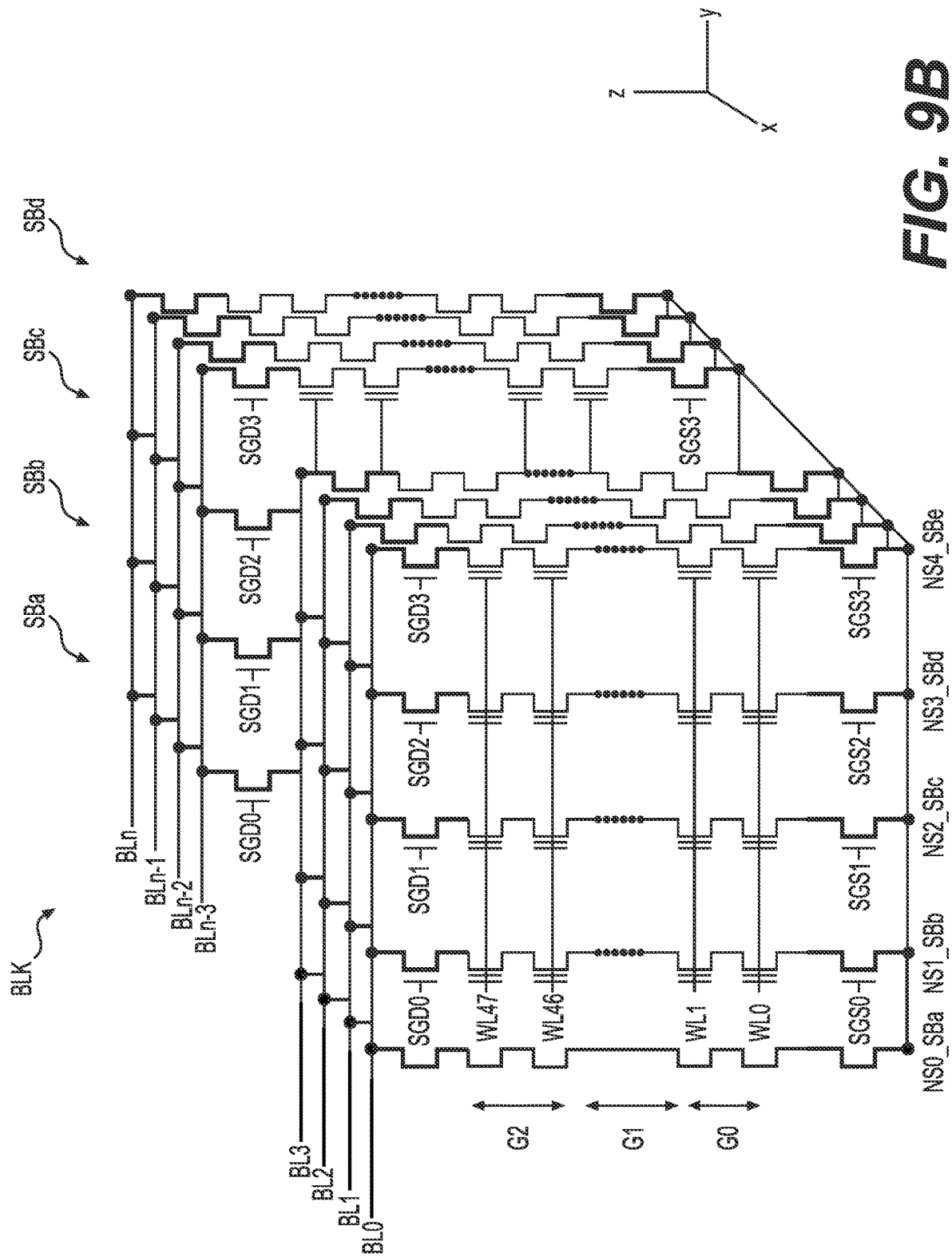
FIG. 9B illustrates another example view of NAND strings in sub-blocks.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

Figure 13:
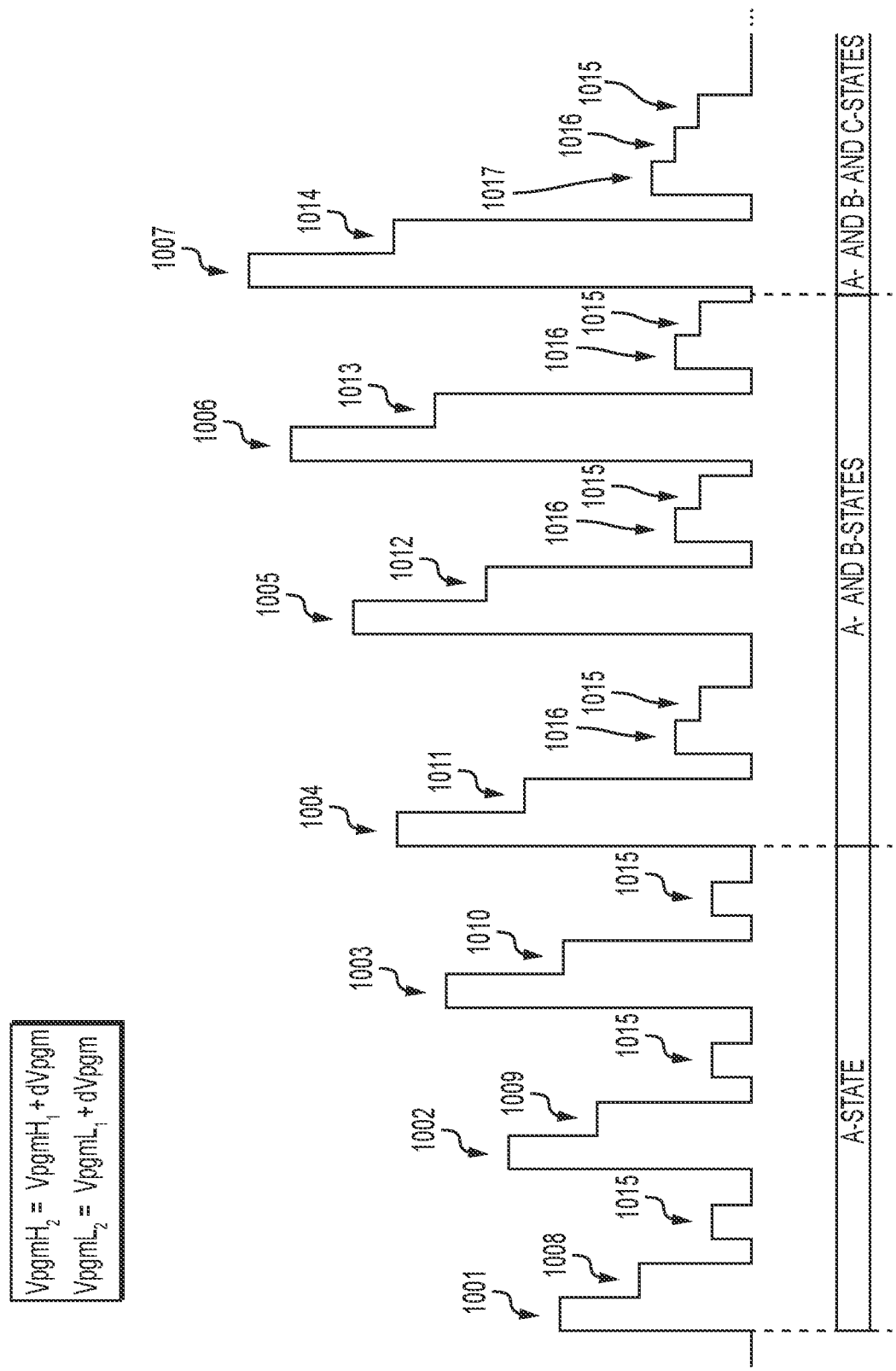
FIG. 13 illustrates the Vth distributions of memory cells in an example program and verify operation with at least four data states.

FIG. 13 illustrates a waveform of an example program and verify operation. The horizontal axis illustrates program loop numbers and the vertical axis illustrates program voltages and program verify voltages. Each iteration of the example program and verify operation may involve applying, to the selected word line, multiple program voltages (e.g., VpgmH and VpgmL) and one or more verify voltages (e.g., VvA, VvB, etc.). In some embodiments, each program voltage may be applied to specific memory cells or memory cell groups of the selected word line based on whether a given memory cell corresponds to a low data state (e.g., S1 to S8 or states A-H in FIG. 12) or a high data state (e.g., S9 to S15 or states I-O in FIG. 12). Additional information relating to these embodiments is described in connection with FIGS. 15A-15F.

For each program or verify voltage, a waveform is illustrated for simplicity. The waveform may be any number of shapes, such as the shapes shown, a square, a multilevel shape, a ramped shape, and/or the like. Additionally, while one or more embodiments refer to the multiple program voltages as including two program voltages (VpgmH and VpgmL), it is to be understood that this is provided by way of example. In practice, more than two program voltages may be used to program the memory cells. For example, memory cells of a selected word line could be segmented into three or more memory cell groups, where each group corresponds to a set or range of data states. In this example, a separate program voltage could be used to program each respective memory cell group.

As used herein, a set of program voltages and a set of verify voltages, which are used as part of the program and verify operation, may be referred to collectively as a pulse train. The set of program voltages may include a first subset of program voltages and a second subset of program voltages. The first subset of program voltages may be applied to memory cells corresponding to high data states and may be represented as $VpgmH_1, VpgmH_2, \ldots, VpgmH_n$, where n is equal to a number of iterations performed to successfully program the memory cells. The second subset of program voltages may be applied to memory cells corresponding to low data states and may be represented using $VpgmL_1, VpgmL_2, \ldots, VpgmL_n$, where n is equal to the number of iterations performed to successfully program the memory cells. In some embodiments, the control circuitry may be configured to increase an amplitude of each program voltage (e.g., VpgmH, VpgmL, etc.) for each successive iteration of the program and verify operation. The program voltages may, for example, be increased using a voltage bias (dVpgm) and/or a similar type of voltage value. In some embodiments, a number of verify voltages used to verify whether memory cells have been programmed may, for example, be based on a number of target data states which are being verified. The number of target data states being verified may, for example, correspond to a number of memory cells associated with the word line.

In some embodiments, each iteration of a program and verify operation may include a pulse train of two program voltages and one or more verify voltages. The description below will illustrate seven example iterations of the program and verify operation.

As a preliminary step (not shown), bit lines associated with low data states may first be provided with an inhibit program voltage (VDDSA), such that memory cells connecting to each respective bit line are temporarily inhibited from being programmed. To begin to program memory cells corresponding to high data states, a first program voltage, such as program voltage 1001, is provided to the selected word line. Memory cells associated with low data states are inhibited from being programmed based on being provided with the inhibit program voltage (VDDSA).

Next, bit lines associated with the low data state memory cells may be discharged from a voltage level corresponding to the inhibit program voltage (VDDSA) to zero volts (or to a voltage level that allows each memory cell associated with a low data state to be programmed). Next, a voltage level of the selected word line may be discharged from a voltage level corresponding to the first program voltage to a voltage level corresponding to a second program voltage, such as program voltage 1008.

After the voltage level of the selected word line is discharged to the voltage level corresponding to the second program voltage, a first verify voltage, such as verify voltage 1015 is provided to the selected word line. A program voltage and corresponding verify voltage can be separated by applying zero Volts (0 V) to the selected word line between the program voltage and the verify voltage. In this way, the first program voltage can be used to begin to program memory cells corresponding to high data states, the second program voltage can be used to begin to program memory cells corresponding to low data states, and the first verify voltage can be used to attempt to verify at least a subset of all of the memory cells.

The second iteration of the program and verify operation may include first program voltage 1002, second program voltage 1009, and verify voltage 1015. First and second program voltages 1002, 1009 have each been increased from first and second program voltages 1001, 1008 respectively by dVpgm. This pattern continues for subsequent iterations of the program and verify operation. Specifically, the third iteration may include first program voltage 1003, second program voltage 1010, and verify voltage 1015. The fourth iteration may include first program voltage 1004; second program voltage 1011; and two verify voltages including first voltage 1016 and then lesser second voltage 1015. The fifth iteration may include first program voltage 1005, second program voltage 1012, and verify voltages 1016, 1015. The sixth iteration may include first program voltage 1006, second program voltage 1013, and verify voltages 1016, 1015. The seventh iteration may include first program voltage 1007; second program voltage 1014; and three verify voltages, first verify voltage 1017, then lesser verify voltage 1016, and finally still lesser verify voltage 1015. The seven iterations shown are intended to be a subset of the total number of iterations of the program and verify operation. For example, the word line may have sixteen memory cells and additional iterations may be performed when programming an additional subset of memory cells.

Figure 14:
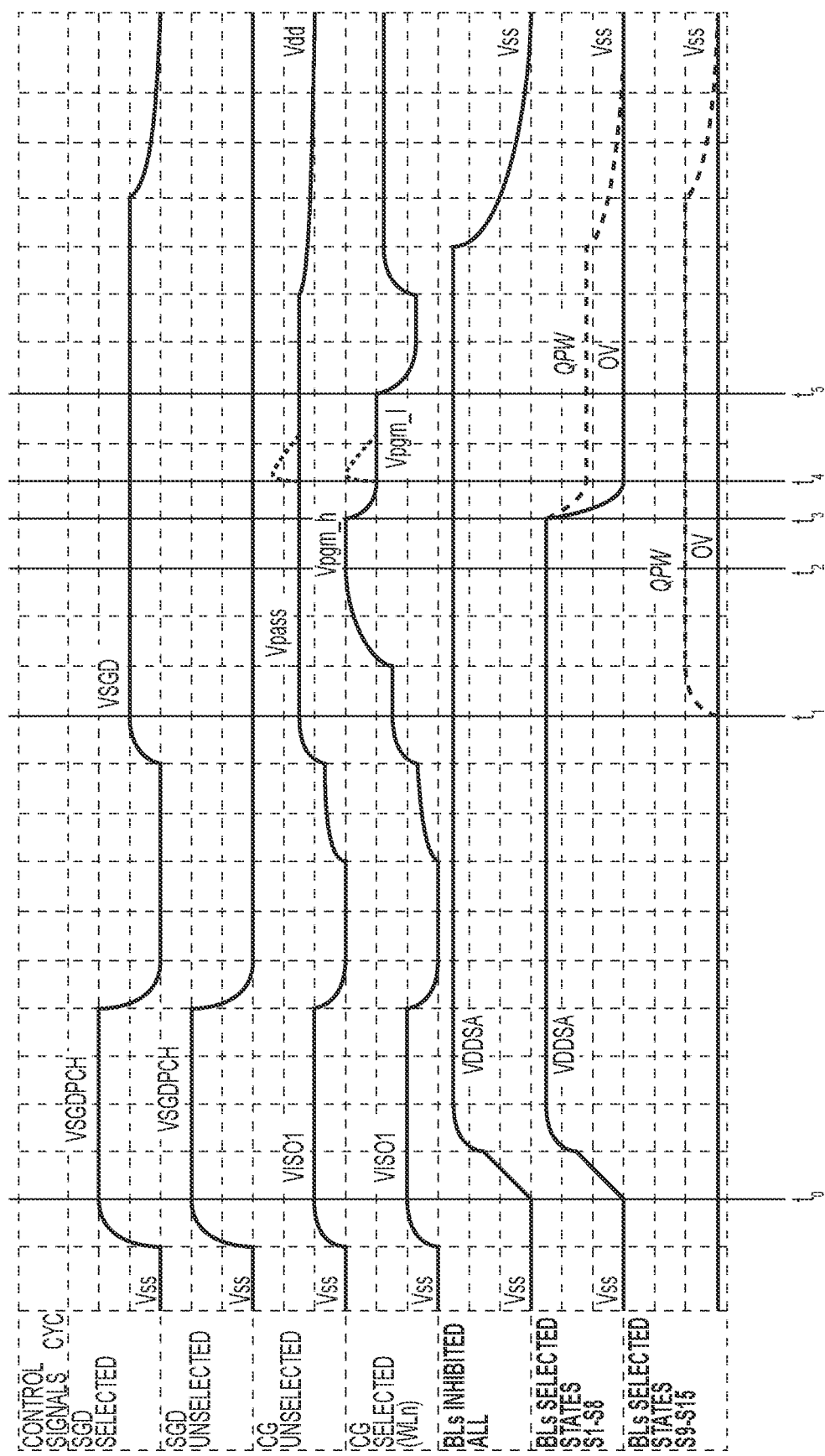
FIG. 14 illustrates the voltages applied to various components of the memory block during an example program and verify operation.

FIG. 14 illustrates a plot that captures various voltage levels applied to a word line (WLn) during a program and verify operation. Specifically, FIG. 14 illustrates the voltages applied to a selected SGD, to an unselected SGD, to an unselected control gate (CG), to a selected CG associated with WLn, to the inhibited bit lines (BLs) that are not to be programmed, to the selected bit lines associated with the memory cells to programmed to states S1-8 (e.g., A-H in FIG. 12), and to the selected bit lines associated with the memory cells to be programmed to states S9-15 (e.g., I-O in FIG. 12). At time $t_0$, the voltage levels applied to the inhibited bit lines and of the selected bit lines corresponding to states S1-8 are increased to an inhibit voltage VDDSA to prevent programming of those bit lines at this time while the voltage levels applied to the selected bit lines corresponding to states 9-15 remain at or near zero volts (0 V).

With the voltage levels of the selected bit lines remaining constant (or with the voltage levels of the selected bit lines corresponding to states S9-15 being slightly increased according to an exception discussed below), the voltage level of the selected control gate is ramped to the first programming voltage VpgmH, which is reached at approximately time $t_2$ to begin programming the bit lines corresponding to states S9-15 without programming the bit lines corresponding to states S1-8.

At approximately time $t_3$, the voltage level of the selected control gate begins ramping down from the first programming voltage VpgmH to the lesser second programming voltage VpgmL while the voltage levels of the bit lines corresponding to states S1-8 are reduced from VDDSA to approximately zero volts (0 V) to allow programming to start for the bit lines corresponding to states S1-8.

At approximately time $t_4$, the voltage levels of the bit lines corresponding to states S1-S8 are approximately at zero volts (0 V), and the voltage levels of both the unselected and selected control gate may be temporarily boosted and then allowed to fall to their respective Vpass and VpgmL levels, thereby counteracting any decrease in these voltages that may be caused from the decrease in the voltages applied to the bit lines to be programmed to states S1-8 that started at time $t_3$.

At approximately time $t_5$, the programming portion of the loop has been completed, and the voltage level of the selected control gate is reduced. The verify portion of the program and verify loop may then begin.

In certain program and verify loops, such as those associated with the second stage of a two-stage programming cycle, the voltage levels of the selected bit lines can be controlled to allow for more precise and controlled programming. At time t1, which is between times to and $t_2$, the voltage levels of the bit lines corresponding to states S9-15 are increased to a voltage level QPW that is greater than zero Volts (0 V) but less than VDDSA. Alternately or additionally, the voltage levels of the bit lines corresponding to states S1-8 are decreased from VDDSA to QPW.

FIGS. 15A-15F illustrate an example process 1100 for programming a set of memory cells 1106 of a selected word line (shown as $WL_n$). One or more embodiments described in connection with FIGS. 15A-15F may be implemented using a non-volatile memory device 1102 that includes a control circuitry 1104 and the set of memory cells 1106. For example, as will be shown, the control circuitry 1104 may program the set of memory cells by performing a program and verify operation, where each iteration of the program and verify operation includes two program voltage and one or more verify voltages. In some embodiments, the program and verify operation may include a first portion and a second portion. For example, the first portion of the program and verify operation may be a first stage of a multi-stage operation and the second portion of the program and verify operation may be a second stage of the multi-stage operation.

The control circuitry 1104 may include a state machine capable of communicating with each respective memory cell of the selected word line. In some embodiments, the selected word line may include sixteen quad-level cells (QLCs). For ease of illustration, only a portion of these memory cells are depicted in the example shown in FIGS. 15A-15F (e.g., memory cell (MC) 0, MC 1, MC 2, MC 7, MC 8, and MC 15). The selected word line may be connected to a set of bit lines, which include bit line (BL) 0, BL 1, BL 2, . . . , and BL 15. A subset of these bit lines is shown in FIGS. 15A-15F (e.g., BL 0, BL 1, BL 2, BL 7, BL 8, and BL 15). It is to be understood that this is provided by way of example, and that in practice, one or more features and/or techniques described herein may be implemented on any number of memory cells that connect to any number of word lines and/or bit lines.

In some embodiments, the set of memory cells 1106 may include memory cells corresponding to high data states and memory cells corresponding to low data states. In several parts of this document, the memory cells corresponding to low data states may be referred to as a first subset of memory cells, of the set of memory cells in the selected word line. Alternatively, these memory cells may be referred to herein as low data state memory cells. Additionally, the memory cells corresponding to high data states may be referred to as a second subset of memory cells, of the set of memory cells in the selected word line. Alternatively, these memory cells may be referred to herein as high data state memory cells. As will be described, the memory cells corresponding to high data states may be programmed using a first program voltage (VpgmH) and the memory cells corresponding to low data states may be programmed using a second program voltage (Vpgm L).

Figure 15A:
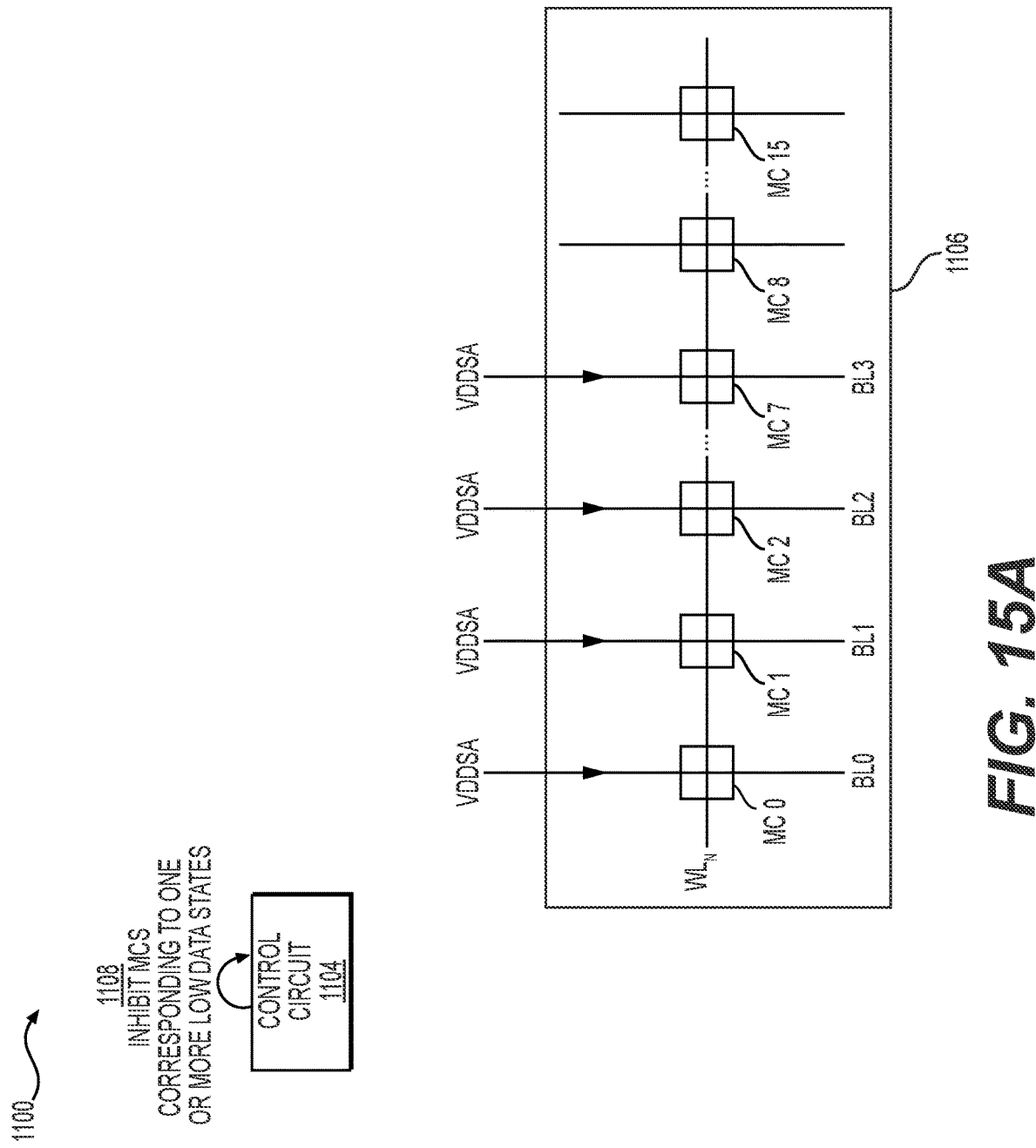
FIGS. 15A-15F illustrate an example process for programming memory cells of a selected word line.

As shown in FIG. 15A by reference number 1108, the control circuitry 1104 may inhibit memory cells corresponding to one or more low data states from being programmed. For example, the control circuitry 1104 may provide respective memory cells, of the first subset of memory cells corresponding to low data states, with an inhibit program voltage (VDDSA), such that these memory cells are temporarily inhibited from being programmed.

The inhibit program voltage (VDDSA) may refer to a power supply voltage, such as a sense amplifier supply voltage and/or a similar type of voltage. A memory cell may correspond to a low data state based on the memory cell being configured to be programmed into one of the first eight data states (e.g., in a sequence of sixteen data states). For example, each memory cell may have up to four bits. In the example shown, each memory cell may have four bits. Thus, a memory cell may correspond to a low data state based on the memory cell being configured to being programmed into data state 0000, data state 0001, data state 0010, data state 0011, data state 0100, data state 0101, data state 0110, or data state 0111.

In some embodiments, the control circuitry 1104 may provide the inhibit program voltage (VDDSA) to bit lines associate with the first subset of memory cells corresponding to low data states. For example, the control circuitry 1104 may provide bit lines connecting to each respective memory cell, of the first subset of memory cells, with the inhibit program voltage (VDDSA) such that each memory cell is inhibited from being programmed.

In some embodiments, the control circuitry 1104 may cause memory cells corresponding to one or more other word lines (e.g., word lines other than the selected word line) to be inhibited from being programmed. For example, the control circuitry 1104 may provide another inhibit program voltage (VPass) to one or more other word lines (e.g., neighboring word lines near the selected word lines) such that memory cells of the one or more other word lines are inhibited from being programmed by program voltages that will be used to program the memory cells of the selected word line. The other inhibit program voltage (VPass) may, for example, have a voltage value of eight volts, nine volts, ten volts, and/or a similar voltage value.

Figure 15B:
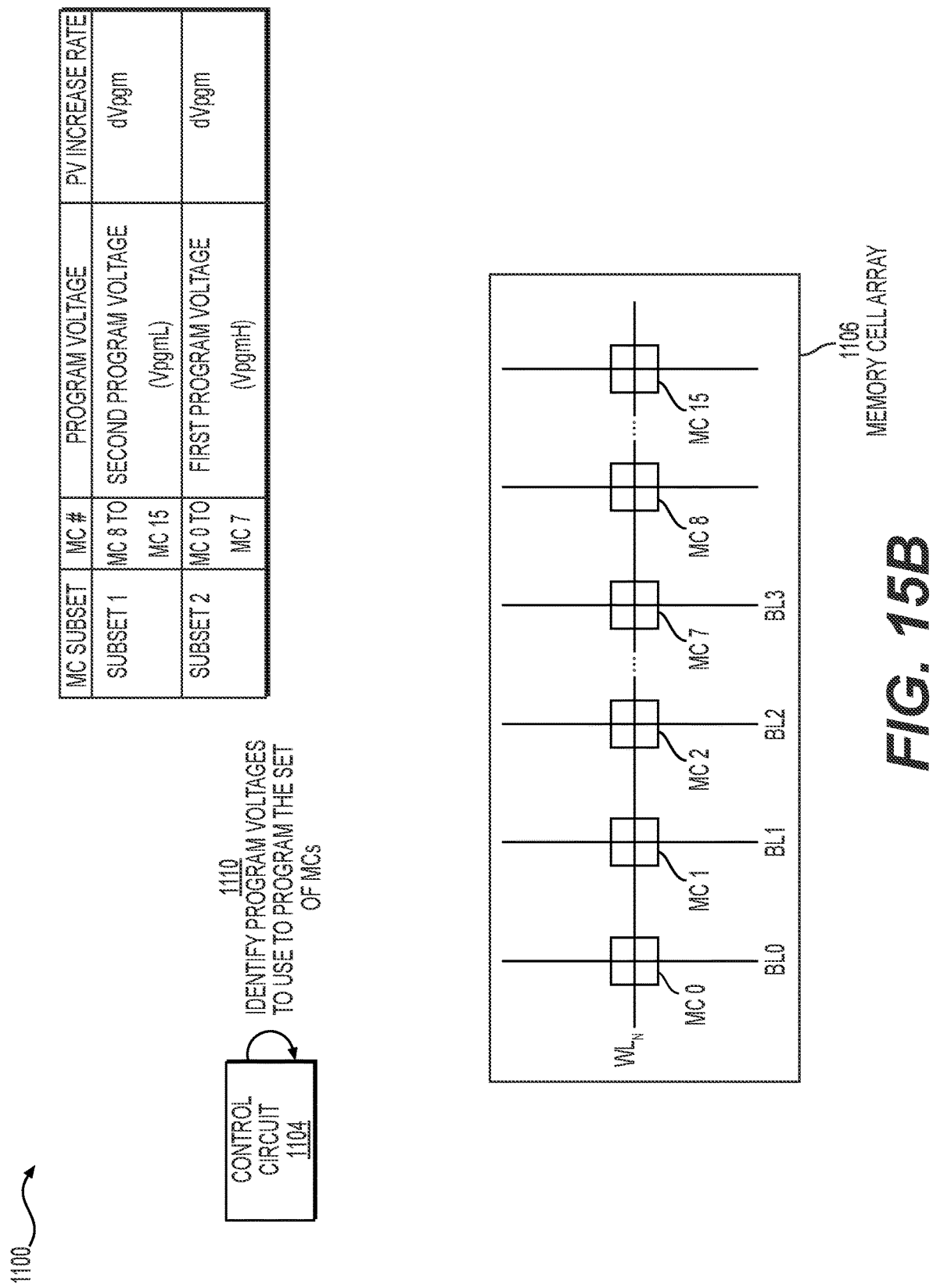

As shown in FIG. 15B by reference number 1110, the control circuitry 1104 may identify program voltages to use to program the set of memory cells. For example, the control circuitry 1104 may identify a first program voltage (VpgmH) for programming the second subset of memory cells corresponding to the high data states and/or may identify a second program voltage (VpgmL) for programming the first subset of memory cells corresponding to the low data states.

In some embodiments, the control circuitry 1104 may receive program command data (e.g., from a controller associated with the non-volatile memory device) and the program command data may specify data states that each respective memory cell is to be programmed into. Additionally, or alternatively, the control circuitry may identify the data states by performing one or more read operations (sometimes referred to as sense operations). For example, the control circuitry may perform a read operation that includes providing a signal to a data latch of a memory cell. The signal may cause the data latch to provide the control circuitry with a return signal capable of identifying the data state. The control circuitry may perform a read operation for each respective memory cell connected to the selected word line.

In this way, the control circuitry 1104 is able to identify multiple program voltages to use during each respective iteration of the program and verify operation.

Figure 15C:
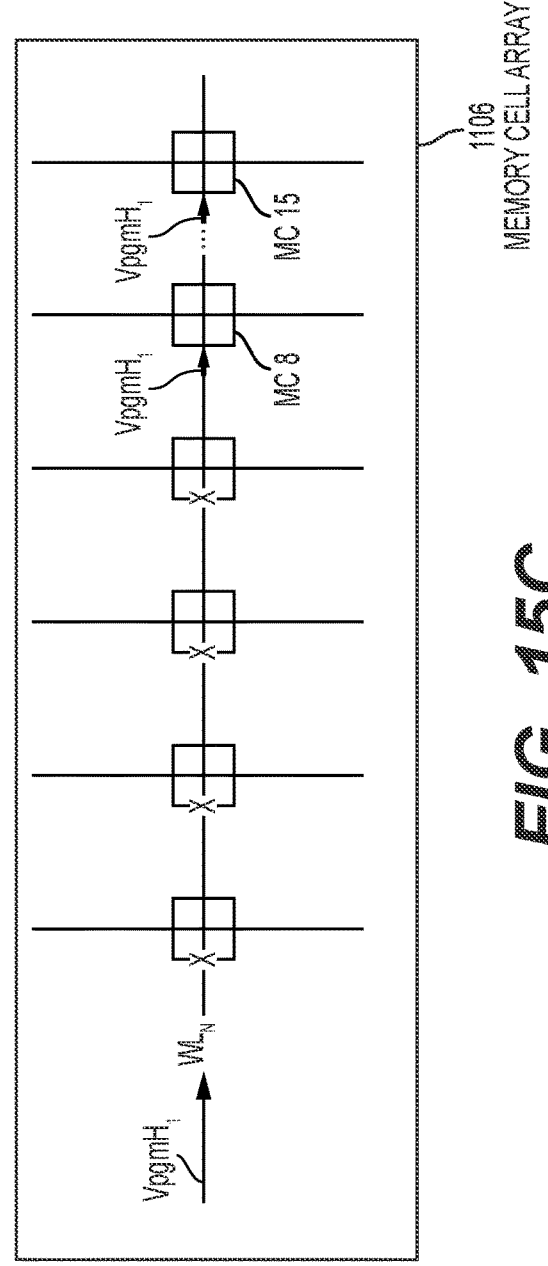

As shown in FIG. 15C by reference number 1112, the control circuitry 1104 may provide the first program voltage (VpgmH) to the second subset of memory cells corresponding to the high data states. For example, the control circuitry 1104 may provide the first program voltage (VpgmH) to control gates of each memory cell of the second subset of memory cells. The first program voltage (VpgmH) may be provided as part of a first iteration of a program portion of the program and verify operation perform. Furthermore, because the first subset of memory cells were provided with the inhibit voltage (VDDSA), the first subset of memory cells are charged to a voltage level that will inhibit the first subset of memory cells from being programmed with the first program voltage.

By inhibiting the first subset of memory cells from being programmed, the control circuitry 1104 is able to begin programming the second subset of memory cells without the first program voltage affecting memory cells corresponding to the low data states.

Figure 15D:
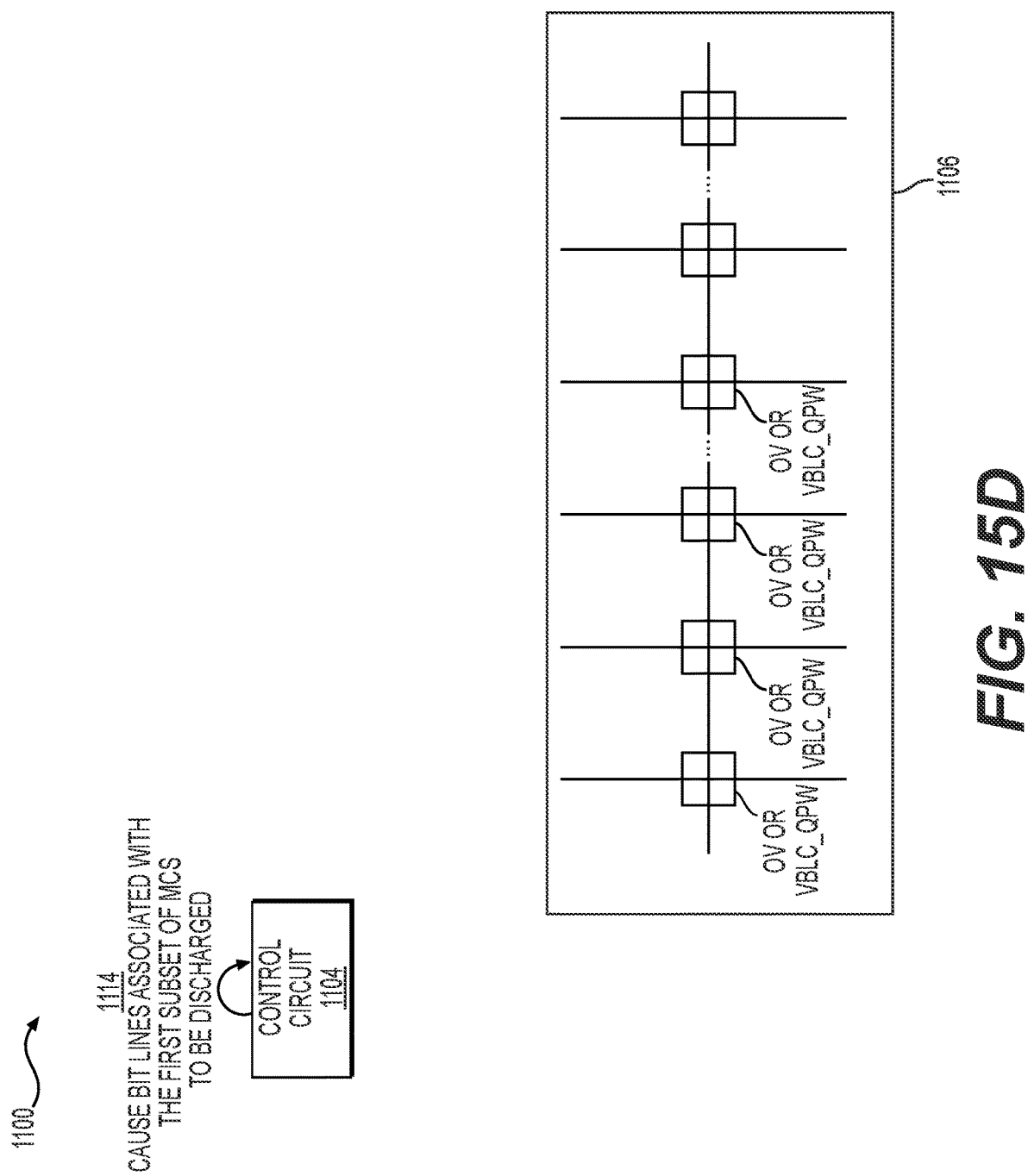

As shown in FIG. 15D by reference number 1114, the control circuitry 1104 may cause bit lines associated with the first subset of memory cells to be discharged to enable the first subset of memory cells to be programmed. For example, the control circuitry 1104 may cause bit lines associated with the first subset of memory cells (which correspond to the low data states) to be discharged from a first voltage level corresponding to the inhibit program voltage (VDDSA) to a second voltage level of zero volts (or to another voltage level that allows each memory cell to be programmed, such as a second voltage level corresponding to VBLC-QPW).

The control circuitry 1104 may cause a bit line to be discharged by waiting for a threshold time period before performing the next portion of the program and verify operation. The threshold time period may be any time period sufficient to allow the bit line to be discharged to a configured voltage level (e.g., such as zero volts).

In this way, the control circuitry 1104 removes the inhibit program voltage (VDDSA) such that the first subset of memory cells are able to be programmed.

Figure 15E:
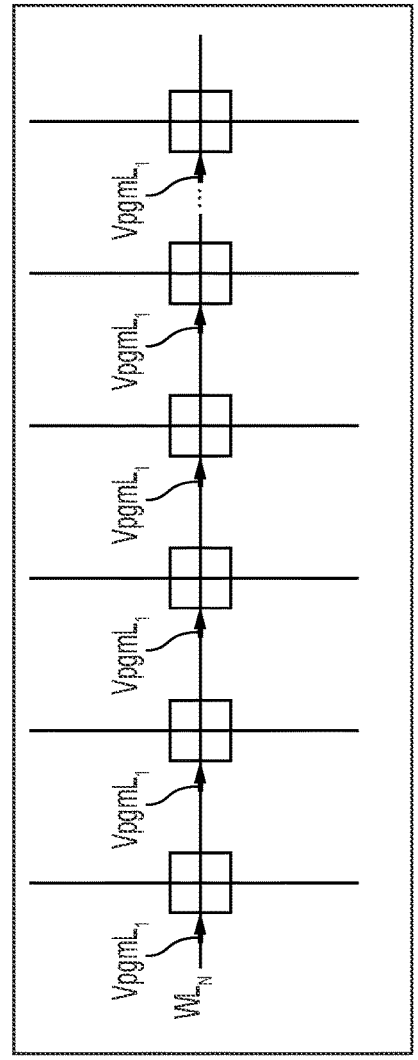

As shown in FIG. 15E by reference number 1116, the control circuitry 1104 may cause a voltage level of the selected word line to discharge to a voltage level corresponding to a second program voltage ($VpgmL_1$). For example, the control circuitry 1104 may cause a voltage level of the selected word line to discharge from a first voltage level, which corresponds to the first program voltage (VpgmH$_1$), to a second voltage level corresponding to a second program voltage (VpgmL$_1$). The voltage level of the selected word line may be discharged as part of the first iteration of the program portion of the program and verify operation.

Because the inhibit program voltage (VDDSA) has been discharged from the first subset of memory cells, the second program voltage (VpgmL$_1$) will be used to program each respective memory cell of the first subset of memory cells. While the second program voltage (VpgmL$_1$) is also provided to the second subset of memory cells, this will not impact the programming of these memory cells as each of these memory cells is configured with higher threshold voltages.

In some embodiments, to discharge the voltage level of the selected word line, the control circuitry 1104 may wait a threshold time period before performing a verify portion of the program and verify operation. This may allow the voltage level of the selected word line to dissipate from the first program voltage (VpgmH$_1$) to the second program voltage (VpgmL$_1$). In some embodiments, the threshold time period used in connection with the selected word line may be different than a threshold time period used in connection with the bit lines associated with the first subset of memory cells corresponding to the low data states.

In some embodiments, discharging bit lines associated with the first subset of memory cells may cause a reduction in the strength of one or more program voltages (Vpgm, VPass, etc.). In this case, the control circuitry 1104 may be configured to cause a spike in program voltage so as to offset the reduction that discharging the bit lines caused in the one or more program voltages. For example, as will be described, a step-up program voltage (e.g., dVpgm) may be applied during each successive iteration of the program and verify operation. The control circuitry 1104 may, for example, be configured to cause the spike in program voltage by applying a compensation program voltage (a spiked Vpgm) for one of the subsequent iterations of the program and verify operation (e.g., whereas other iterations will simply apply a voltage that has been increased by the step-up program voltage). In some embodiments, the compensation program voltage may have a voltage level that is loop-dependent. For example, a voltage level applied as the compensation program voltage may vary based on a degree to which the discharged bit lines has affected the program voltage (Vpgm) of the selected word line. Additionally, or alternatively, the control circuitry 1104 may cause a similar spike in the inhibit program voltage (VPass) provided to other word lines in the vicinity of the selected word line.

In this way, the control circuitry 1104 performs the first iteration of the program portion of the program and verify operation.

Figure 15F:
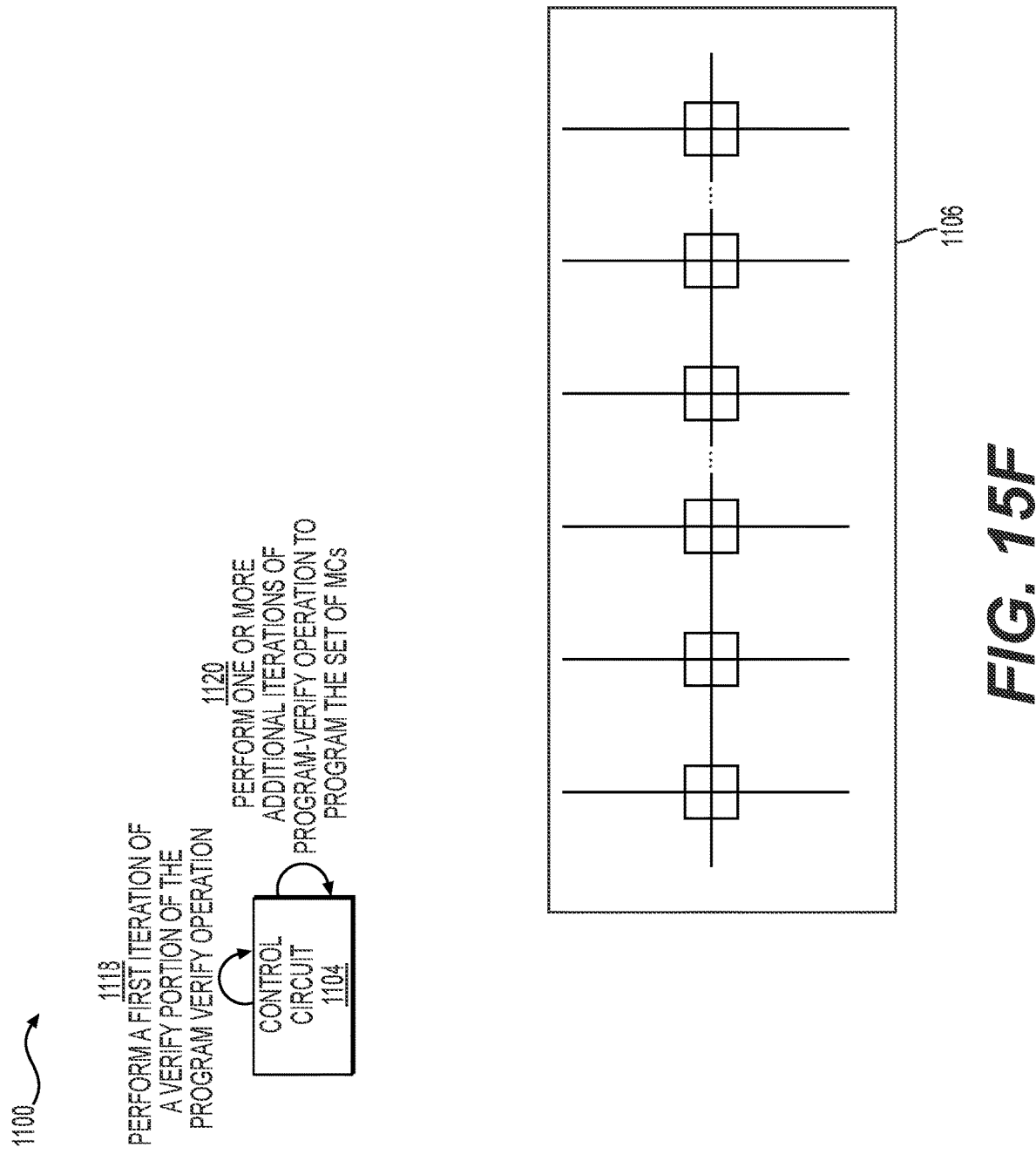

As shown in FIG. 15F by reference number 1118, the control circuitry 1104 may perform a first iteration of a verify portion of the program and verify operation. For example, the control circuitry 1104 may perform a first iteration of a verify operation on the first and second subset of memory cells of the selected word line.

In some embodiments, the control circuitry 1104 may perform the verify operation using one or more bit line voltage biases. For example, the control circuitry 1104 may apply a bit line voltage bias to one or more bit lines corresponding to memory cells being verified, may apply an initial verify voltage (VvA) to the selected word line, and/or may verify whether each respective memory cell has been programmed based on whether each memory cell has a threshold voltage Vth that satisfies (e.g., is above) the initial verify voltage (VvA).

Additionally, or alternatively, the control circuitry 1104 may perform the verify operation using one or more sense times. For example, the control circuitry 1104 may perform the verify operation in a manner that utilizes one or more sense times to adjust a threshold voltage (Vth) of memory cells in the selected word line. To provide a specific example, one or more sense times may have been used to control pre-charge voltages (PCVs) that affect threshold voltages of respective memory cells while the verify operation is being performed. A sense time may, for example, indicate a duration during which a capacitor can charge a sense node of a memory cell that corresponds to a bit line connecting to the selected word line. To apply the one or more sense times, the control circuitry 1104 may provide signals to voltage clamps to set pre-charge voltages at particular sense nodes associated with the memory cells. The control gate voltages (VCGs) of memory cells may be ramped up over time for a duration indicated by a given sense time.

In some embodiments, the control circuitry 1104 may verify all memory cells of the selected word line. In some embodiments, the control circuitry 1104 may verify a portion of the memory cells of the selected word line. For example, if an initial verify voltage (VvA) is being used for the first iteration of the verify operation, the control circuitry 1104 may be configured to only attempt to verify a portion of the first subset of memory cells corresponding to the low data states. This conserves resources relative to attempting to verify all memory cells (e.g., because certain memory cells are going to have data states corresponding to threshold voltages (Vths) that would not be satisfied (e.g., higher than) the initial verify voltage (VvA).

In this way, the control circuitry 1104 verifies whether memory cells included in the first and second subsets of memory cells have been programmed. This conserves resources (e.g., computing resources, power resources, memory resources, and/or the like) relative to verifying the first and second subsets of memory cells separately (e.g., during separate iterations of the program and verify operation). For example, by verifying the first subset of memory cells and the second subset of memory cells separately, the control circuitry 1104 conserves resources by reducing a total number of iterations of the program and verify operation that will be needed to program the memory cells of the selected word line.

In some embodiments, the control circuitry 1104 may cause a memory cell that has been verified to be locked out from further programming. For example, if the control circuitry 1104 verifies that a memory cell has completed programming, the control circuitry 1104 may cause that memory cell to be locked out from further programming, such that the memory cell is unaffected while programming continues for other memory cells during subsequent program and verify iterations.

As shown by reference number 1120, the control circuitry 1104 may perform one or more additional iterations of the program and verify operation to program the memory cells of the selected word line. For example, the control circuitry 1104 may perform one or more additional iterations of the program and verify operation by incrementally increasing the first and second program voltages. As described above, the first and second program voltages may be increased using a step-up program voltage (dVpgm) or a compensation program voltage (spiked Vpgm). The control circuitry 1104 may perform the one or more additional program and verify operations in a manner consistent with the initial iteration of the program and verify operation described above. For example, the control circuitry 1104 may increase the first program voltage (VpgmH) and the second program voltage (VpgmL) using the following equations:

$$VpgmH_2 = VpgmH_1 + dVpgm \quad (1)$$

$$VpgmL_2 = VpgmL_1 + dVpgm \quad (2)$$

In equations (1) and (2) above, $VpgmH_1$ represents the first program voltage during the first iteration of the program operation, $VpgmH_2$ represents the first program voltage (VpgmH) during a second iteration of the program operation, $VpgmL_1$ represents the second program voltage (VpgmL) during the first iteration of the program operation, $VpgmL_2$ represents the second program voltage (VpgmL) during the second iteration of the program operation, and dVpgm represents the step-up voltage.

In some embodiments, the control circuitry 1104 may perform one or more additional iterations of the program and verify operation until a stop condition has been satisfied. The stop condition may, for example, be satisfied based on all memory cells being verified, based on a final memory cell in the selected word line being verified, and/or based on another type of configurable stop condition being satisfied.

In this way, the control circuitry 1104 performs the program and verify operation to program and verify the set of memory cells of the selected word line. By performing the program and verify operation as described herein, the control circuitry 1104 reduces a total program pulse count and reduces a charge-up time for selected and unselected word lines (e.g., time spent charging up to Vpgm, VPass, etc.). This conserves relative to program and verify operations with higher program pulse counts and/or higher charge-up times for selected and unselected word lines.

Figure 16:
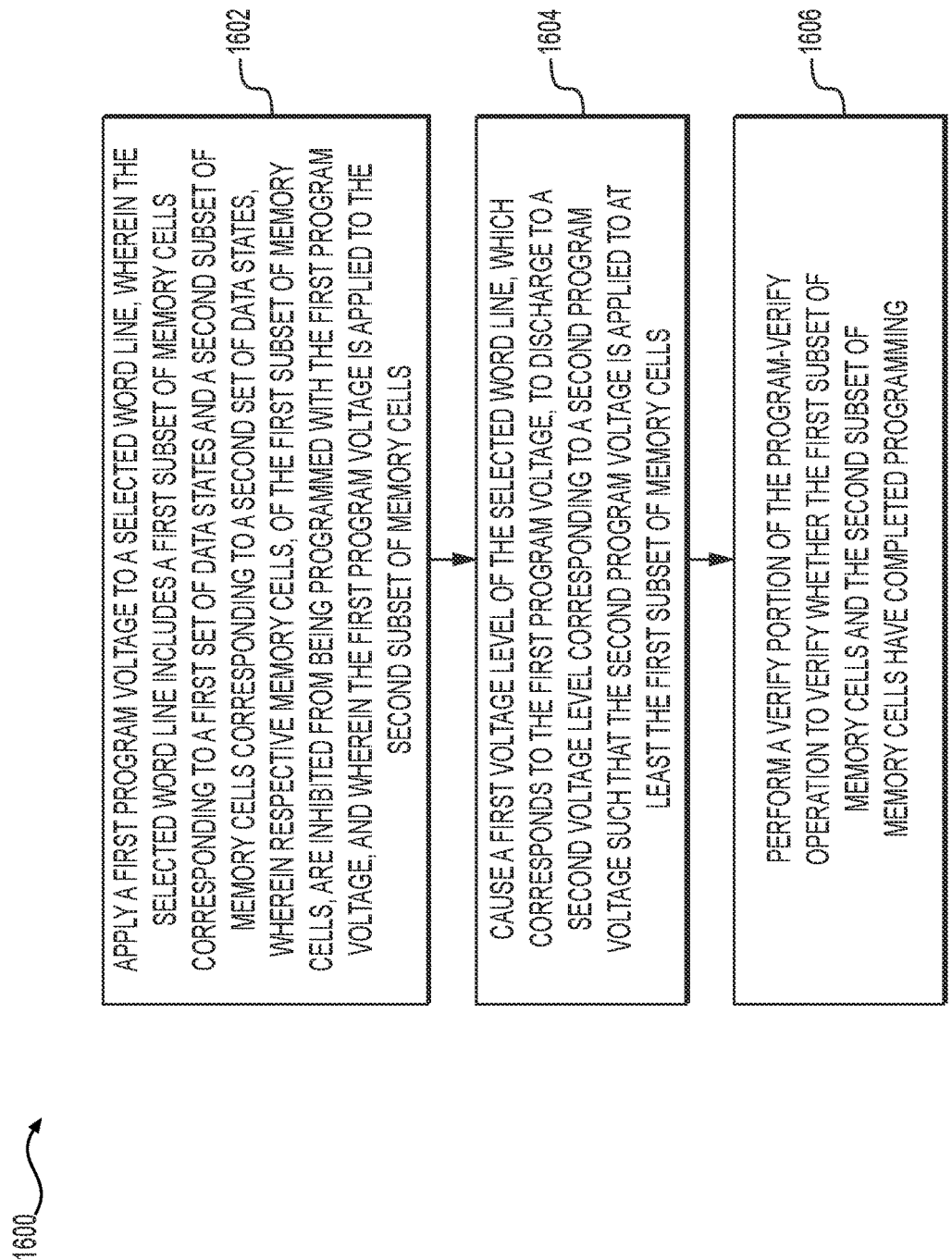
FIG. 16 is a flow diagram illustrating a method for performing a program and verify operation to program a set of memory cells of a selected word line, according to the principles of the present disclosure.

FIG. 16 is a flow diagram illustrating a method 1600 for performing a program and verify operation to program a set of memory cells of a selected word line, according to the principles of the present disclosure. For example, a control circuitry (e.g., the control circuitry 1104) may perform one or more iterations of a program and verify operation to program a set of memory cells of a selected word line. The control circuitry may be part of a memory device, such as the memory device 1102.

Step 1602 applies a first program voltage to a selected word line. For example, the control circuitry may apply a first program voltage to a selected word line. The selected word line may include a first subset of memory cells corresponding to a first set of data states and a second subset of memory cells corresponding to a second set of data states. The first set of data states may, for example, be associated with one or more data states that are lower than data states that are associated with the second subset of memory cells.

In some embodiments, respective memory cells, of the first subset of memory cells, may be inhibited from being programmed with the first program voltage. For example, prior to applying the first program voltage, the method 1600 may further include applying an inhibit program voltage to bit lines corresponding to the first subset of memory cells such that the first subset of memory cells are inhibited from being programmed with the first program voltage. Additionally, or alternatively, the first program voltage may be applied to the second subset of memory cells. To particular a particular example, in a QLC memory cell, the first set of data states may include data states 1-8 and the second set of data states may include data states 9-15. In this example, data states 1-8 may be programmed using the second program voltage and data states 9-15 may be programmed using the first program voltage.

Step 1604 causes a first voltage level of the selected word line to discharge to a second voltage level corresponding to a second program voltage such that the second program voltage is applied to at least the first subset of memory cells. For example, the control circuitry may cause a first voltage level of the selected word line, which corresponds to the first program voltage, to discharge to a second voltage level corresponding to a second program voltage such that the second program voltage is applied to at least the first subset of memory cells.

In some embodiments, the method 1600 may further include causing bit lines associated with the first subset of memory cells to be discharged to zero volts. For example, the control circuitry may cause bit lines associated with the first subset of memory cells to be discharged from a voltage value corresponding to the inhibit program voltage (e.g., VDDSA) to a voltage value of zero volts.

Step 1606 performs a verify portion of the program and verify operation to verify whether the first subset of memory cells and the second subset of memory cells have completed programming. For example, the control circuitry may perform a verify operation to verify whether memory cells, of the first and second subsets of memory cells, have completed programming. In some embodiments, the control circuitry may verify, using a set of verify voltages, whether one or more memory cells of the memory cells of the selected word line have completed programming. In some embodiments, the control circuitry may verify whether the first subset of memory cells has completed programming using a first set of verify voltages and may verify whether the second subset of memory cells has completed programming using a second set of verify voltages.

In some embodiments, the method 1600 may further include one or more steps for performing one or more additional iterations of the program and verify operation. For example, the control circuitry may perform one or more additional iterations of the program and verify operation by incrementally increasing the first program voltage and the second program voltage during successive iterations of the program and verify operation. In some embodiments, the control circuitry may increase the first program voltage and the second program voltage using a step-up program voltage. In some embodiments, the control circuitry may increase the first program voltage and the second program voltage using a compensation program voltage. For example, by discharging the bit lines associated with the first subset of memory cells to zero volts, the control circuitry may have caused a reduction in the voltage levels of a program voltage (Vpgm) and/or an inhibit word line program voltage (VPass). To offset or compensate for the reduction, the control circuitry may apply a compensation program voltage to the selected word line during one or more iterations of the program and verify operation. This may cause a spike that is capable of offsetting and/or compensating for the reduction in the voltage levels of the program voltage (Vpgm) and/or the inhibit word line program voltage (VPass). The control circuitry may perform these iterations until a stop condition is satisfied.

The foregoing detailed description of the present disclosure has been presented for purposes of illustration and description. It is not intended to be exhaustive or to limit the present disclosure to the precise form disclosed. Many modifications and variations are possible in light of the above teachings. The described embodiments were chosen in order to best explain the principles of the present disclosure and its practical application, to thereby enable others skilled in the art to best utilize the present disclosure in various embodiments and with various modifications as are suited to the particular use contemplated. It is intended that the scope of the present disclosure be defined by the claims appended hereto.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two-dimensional and three-dimensional exemplary structures described but covers all relevant memory structures within the spirit and scope of the technology as described herein and as understood by one of skill in the art.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A non-volatile memory device, comprising:
   control circuitry for performing a program and verify operation to program an array of memory cells of a non-volatile memory, wherein the control circuitry, when performing an iteration of the program and verify operation, is configured to:
      apply a first program voltage to a selected word line, wherein the selected word line includes a first subset of memory cells corresponding to a first set of data states and a second subset of memory cells corresponding to a second set of data states, wherein respective memory cells, of the first subset of memory cells, are inhibited from being programmed with the first program voltage, and wherein the first program voltage is applied to the second subset of memory cells corresponding to the second set of data states;
      cause a first voltage level of the selected word line, which corresponds to the first program voltage, to discharge to a second voltage level corresponding to a second program voltage such that the second program voltage is applied to at least the first subset of memory cells; and
      perform a verify portion of the program and verify operation to verify whether the first subset of memory cells and the second subset of memory cells have completed programming.

2. The non-volatile memory device as set forth in claim 1, wherein the control circuitry, prior to applying the first program voltage, is further configured to:
   apply an inhibit program voltage to bit lines corresponding to the first subset of memory cells, wherein each respective memory cell of the first subset of memory cells is inhibited from being programmed with the first program voltage based on the control circuitry applying the inhibit program voltage to the bit lines corresponding to the first subset of memory cells.

3. The non-volatile memory device as set forth in claim 1, wherein the first program voltage has a voltage level that is higher than the second program voltage.

4. The non-volatile memory device as set forth in claim 1, wherein the control circuitry is further configured to cause bit lines associated with the first subset of memory cells to discharge to a third voltage level that is lower than the first voltage level and the second voltage level.

5. The non-volatile memory device as set forth in claim 1, wherein the control circuitry is further configured to perform one or more additional iterations of the program and verify operation, and wherein the control circuitry, when performing the one or more additional iterations of the program and verify operation, is configured to:
   incrementally increase the first program voltage and the second program voltage during successive iterations of the program and verify operation until a stop condition is satisfied.

6. The non-volatile memory device as set forth in claim 5, wherein a compensation program voltage is used to increase the first program voltage and the second program voltage during at least one iteration of the program and verify operation and wherein a step-up program voltage is used to increase the first program voltage and the second program voltage during one or more other iterations of the program and verify operation.

7. The non-volatile memory device as set forth in claim 1, wherein the control circuitry, when performing the verify portion of the program and verify operation, is configured to:
   verify whether one or more memory cells, of the first subset of memory cells, has completed programming using a first set of verify voltages, and
   verify whether one or more memory cells, of the second subset of memory cells, has completed programming using a second set of verify voltages.

8. A method of programming memory cells of a non-volatile memory, the method comprising:
   applying a first program voltage to a selected word line, wherein the selected word line includes a first subset of memory cells corresponding to a first set of data states and a second subset of memory cells corresponding to a second set of data states, wherein respective memory cells, of the first subset of memory cells, are inhibited from being programmed with the first program voltage, and wherein the first program voltage is applied to the second subset of memory cells corresponding to the second set of data states;

causing a first voltage level of the selected word line, which corresponds to the first program voltage, to discharge to a second voltage level corresponding to a second program voltage such that the second program voltage is applied to at least the first subset of memory cells; and performing, as part of the iteration of the program and verify operation, a verify operation to verify whether the first subset of memory cells and the second subset of memory cells have completed programming.

9. The method as set forth in claim 8, wherein the method, prior to applying the first program voltage, further comprises:

applying an inhibit program voltage to bit lines corresponding to the first subset of memory cells, wherein each respective memory cell of the first subset of memory cells is inhibited from being programmed with the first program voltage based on the control circuitry applying the inhibit program voltage to the bit lines corresponding to the first subset of memory cells.

10. The method as set forth in claim 8, wherein the first program voltage has a voltage level that is higher than the second program voltage.

11. The method as set forth in claim 8, further comprising discharging bit lines associated with the first subset of memory cells to zero volts.

12. The method as set forth in claim 8, further comprising performing one or more additional iterations of the program and verify operation, and wherein performing the one or more additional iterations of the program and verify operation comprises:

incrementally increasing the first program voltage and the second program voltage during successive iterations of the program and verify operation until a stop condition is satisfied.

13. The method as set forth in claim 12, wherein a compensation program voltage is used to increase the first program voltage and the second program voltage during at least one iteration of the program and verify operation and wherein a step-up program voltage is used to increase the first program voltage and the second program voltage during one or more other iterations of the program and verify operation.

14. The method as set forth in claim 8, wherein performing the verify operation comprises:

verifying, using a set of verify voltages, whether one or more memory cells of the memory cells of the selected word line have completed programming.

15. A memory device, comprising:

control circuitry for programming memory cells that are part of an array of memory cells of a non-volatile memory, wherein the control circuitry is configured to:

apply a first program voltage to a selected word line, wherein the selected word line includes a first subset of memory cells corresponding to a first set of data states and a second subset of memory cells corresponding to a second set of data states, wherein respective memory cells, of the first subset of memory cells, are inhibited from being programmed with the first program voltage, and wherein the first program voltage is applied to the second subset of memory cells corresponding to the second set of data states;

cause a first voltage level of the selected word line, which corresponds to the first program voltage, to discharge to a second voltage level corresponding to a second program voltage such that the second program voltage is applied to at least the first subset of memory cells; and perform a verify portion of the program and verify operation to verify whether the first subset of memory cells and the second subset of memory cells have completed programming.

16. The memory device as set forth in claim 15, wherein the first program voltage has a voltage level that is higher than the second program voltage.

17. The memory device as set forth in claim 15, wherein the control circuitry is further configured to discharge bit lines associated with the first subset of memory cells to zero volts.

18. The memory device as set forth in claim 15, wherein the control circuitry is further configured to perform one or more additional iterations of the program and verify operation, and wherein the control circuitry, when performing the one or more additional iterations of the program and verify operation, is configured to:

incrementally increase the first program voltage and the second program voltage during successive iterations of the program and verify operation until a stop condition is satisfied.

19. The memory device as set forth in claim 18, wherein a compensation program voltage is used to increase the first program voltage and the second program voltage during at least one iteration of the program and verify operation and wherein a step-up program voltage is used to increase the first program voltage and the second program voltage during one or more other iterations of the program and verify operation.

20. The memory device as set forth in claim 15, wherein the control circuitry, prior to applying the first program voltage, is further configured to:

apply an inhibit program voltage to bit lines corresponding to the first subset of memory cells, wherein each respective memory cell of the first subset of memory cells is inhibited from being programmed with the first program voltage based on the control circuitry applying the inhibit program voltage to the bit lines corresponding to the first subset of memory cells.

* * * * *